(12) United States Patent
Ishii et al.

(10) Patent No.: US 7,449,747 B2
(45) Date of Patent: Nov. 11, 2008

(54) SEMICONDUCTOR MEMORY DEVICE

(75) Inventors: Tomoyuki Ishii, Kodaira (JP); Kazunori Furusawa, Musashino (JP); Hideaki Kurata, Kokubunji (JP); Yoshihiro Ikeda, Takarazuka (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/311,162

(22) Filed: Dec. 20, 2005

(65) Prior Publication Data

US 2006/0097311 A1    May 11, 2006

Related U.S. Application Data

(63) Continuation of application No. 10/684,424, filed on Oct. 15, 2003, now Pat. No. 7,015,540.

(30) Foreign Application Priority Data

Oct. 30, 2002    (JP)    ............ P2002-315968

(51) Int. Cl.
*H01L 29/788*    (2006.01)

(52) U.S. Cl. .............. 257/322; 257/320; 257/321; 257/324; 257/326; 257/316; 257/E21.682; 257/E27.103; 257/E29.308

(58) Field of Classification Search ........... 257/320, 257/321, 322, 324, 326, 316, E21.682, E27.103, 257/E29.308
See application file for complete search history.

(56) References Cited

U.S. PATENT DOCUMENTS 6,803,620 B2 * 10/2004 Moriya et al. ............ 257/298

(Continued)

FOREIGN PATENT DOCUMENTS

JP    2001-156275    6/2001

OTHER PUBLICATIONS

Arai, et al., "High-Density (4.4F²) NAND Flash Technology Using Super-Shallow Channel Profile (SSCP) Engineering," IEEE International Electron Devices Meeting 2000, pp. 775-778.

(Continued)

*Primary Examiner*—Andy Huynh
(74) *Attorney, Agent, or Firm*—Miles & Stockbridge P.C.

(57) ABSTRACT

Flash memory is rapidly decreasing in price. There is a demand for a new memory system that permits size reduction and suits multiple-value memory. A flash memory of AND type suitable for multiple-value memory with multiple-level threshold values can be made small in area if the inversion layer is utilized as the wiring; however, it suffers the disadvantage of greatly varying in writing characteristics from cell to cell. Another promising method of realizing multiple-value memory is to change the storage locations. This method, however, poses a problem with disturbance at the time of operation. The present invention provides one way to realize a semiconductor memory device with reduced cell-to-cell variation in writing characteristics. The semiconductor memory has a source region and a drain region, which are formed parallel to each other, and an assist electrode which is between and parallel to the source and drain regions without overlapping, so that it uses, at the time of writing, the assist electrode as the assist electrode for hot electrons to be injected at the source side and it uses, at the time of reading, the inversion layer formed under the assist electrode as the source region or the drain region.

9 Claims, 26 Drawing Sheets

U.S. PATENT DOCUMENTS

| | | | |
|---|---|---|---|
| 6,888,755 B2 | 5/2005 | Harai | 365/185.18 |
| 2004/0079988 A1 | 4/2004 | Harai | 257/316 |

OTHER PUBLICATIONS

Kobayashi, et al., "A Giga-Scale Assist-Gate (AG)-(AND)-Type Flash Memory Cell with 20-MB/s Programming Throughput for Content-Downloading Applications," IEEE International Electron Devices Meeting 2001 pp. 29-32.

Eitan, et al., "Can NROM, a 2 Bit, Trapping Storage NVM Cell, Give a Real Challenge to Floating Gate Cells?" International Conference on Solid State Devices and Materials 1999, pp. 522-524.

* cited by examiner

SEMICONDUCTOR MEMORY DEVICE

CROSS-REFERENCE TO RELATED APPLICATION

This application is a continuation of application Ser. No. 10/684,424 filed Oct. 15, 2003, now U.S. Pat. No. 7,015,540.

FIELD OF THE INVENTION

The present invention relates to a semiconductor memory device and a semiconductor device, and more particularly to an inexpensive, highly reliable semiconductor memory device.

BACKGROUND OF THE INVENTION

Flash memory (as one of the nonvolatile memory devices) is getting general acceptance for use as a readily portable data storage device. The price per bit of flash memory is rapidly decreasing every year. The rate of price reduction is steeper than that anticipated from the design rule alone. This is due to improvements on the element structure and introduction of the idea of multiple-value storage. The conventional technology of large-capacity flash memory for file use is described in non-patent document Nos. 1 and 2. The former is concerned with a flash memory of NAND type with a small cell area. The latter is concerned with a flash memory of AND type suitable for multiple-value memory or multiple-bit memory which is achieved by controlling the number of electrons stored in the floating gate. Both types contribute to the reduction of cost per bit.

Another example of multiple-value memory is described in non-patent document 3. This document is concerned with an element in which the recording area is formed from SiN and hot electrons are used for charge injection. This device utilizes the phenomenon that hot electrons occur near the drain end and charge is captured by SiN traps (and hence charge accumulates near the injection point). It also utilizes both of the source end and the drain end as the charge storage regions by switching the voltage applied to the source and drain. Since writing in this manner requires a large current and the current supply from the power source is limited, it is not suitable for writing multiple bits at the same time in a file. Patent document 1 discloses writing by injection into the source side which is achieved by a lower drain current. This patent discloses a flash memory in which the inversion layer formed under the assist electrode is used as the wiring. This technology is designed to make the small cell area compatible with the assist electrode for injection at the source side.

[Patent Document 1]
  JP-A No. 156275/2001

[Non-patent Document 1]
  "F. Arai et al., IEEE International Electron Devices Meeting" 2000, pp. 775-778

[Non-patent Document 2]
  "T. Kobayashi et al., IEEE International Electron Devices Meeting" 2001, pp. 29-32

[Non-patent Document 3]
  "B. Eitan et al., International Conference on Solid State Devices and Materials" 1999, p. 522-524

SUMMARY OF THE INVENTION

Flash memories have decreased in cost per bit more than excepted from miniaturization owing to contrivance on the element structure and introduction of the concept of multiple-value memory. Moreover, owing to their increased capacity, they are finding new uses in the area where large files (such as music files and dynamic image files) are handled. Consequently, it is expected that there will be an increasing demand for flash memories with a high capacity capable of high-speed writing.

However, the element of NAND type has been miniaturized to such an extent that the area per cell is approaching $4F^2$ (where F denotes the design rule), which is the theoretical limit of memory cells of flat structure. It is difficult to reduce the cell area further by improving the structure. One way to make a breakthrough is to develop the technology of multiple-value memory. It is also necessary to tackle the problem with low writing speed and high voltage required for writing, which arises from writing by means of Fowler-Nordheim (FN for short) tunnel.

On the other hand, the element of AND type is capable of high-speed writing owing to the hot-electron writing technology. It permits simultaneous writing to many cells because it is based on the hot-electron writing system in which charge is injected into the source side. Moreover, it has an array structure which is in parallel connection but not in serial connection like that of NAND type. Therefore, it is hardly affected by storage information in other cells and is suitable for multiple-bit memory per cell. However, it still has problems. One problem is that it is difficult to reduce the pitch perpendicular to the word line on account of the spreading of the diffused layer or the isolation region. (The reason for this is that the array is constructed such that the diffused layers extend parallel because of the cell area.) One way to address this problem is disclosed in Kamigaki's patent, Example 3. (See the patent document 1.) According to this disclosure, the element functions in such a way that the inversion layer formed under the electrode extending parallel to the data line is used as the wiring. This idea realizes the array system which obviates the necessity of forming the diffused layer by impurity implantation. In this case, writing is accomplished between the adjacent electrodes (which are referred to as electrode 1 and electrode 2 hereinafter). At the time of operation, no voltage (0 V) is applied to the inversion layer under electrode 1 and a high voltage (3.5 V) is applied to the inversion layer under electrode 2, so that the potential applied to electrode 1 is set at 1.5 V (which is not so high) and the inversion layer formed thereunder has a high resistance. This arrangement permits the source side injection, with the electric field concentrated at the end of electrode 1. The problem involved in this system is the position-dependent writing variation. In other words, the distance to contact varies depending on the position of the memory cell, and hence the resistance of the inversion layer under electrode 1 varies depending on the position. The result is that the potential applied to the cell changes as the voltage decreases, and hence the writing characteristics vary from cell to cell.

Accordingly, it is an object of the present invention to provide a process for producing a semiconductor memory device which utilizes the inversion layer as the wiring for recording and has a small cell-to-cell variation in writing characteristics.

It is another object of the present invention to solve the problem with reading disturbance commonly involved in multiple-bit memory. The multiple-bit memory now in practical use accumulates four different amounts of charge in the floating gate, thereby creating a memory state with threshold voltages at four levels and storing two bits. Depending on the amount of charge thus stored, the threshold voltage of the transistor varies and this change is detected for reading. The threshold voltages corresponding to individual pieces of information should be set at certain intervals so that they are read separately and clearly after compensation for the change in characteristics that occurs during information storage and compensation for variation in characteristics among elements. For example, if a separation of about 1 V is necessary, the difference between the maximum and minimum threshold voltages is 3 V for the 2-bit memory; however, this difference becomes 7 V for the 3-bit memory. Injection of charge to such a high voltage requires a high writing voltage. Also, a high control gate voltage is required for reading. These high voltages tend to increase transistor noise in neighboring circuits and need a large chip area (which leads to an increased production cost). The high voltages also destroy stored information by reading and induces so-called reading disturbance.

The multiple-value memory that uses the source end and the drain end as the storage area has the disadvantage of being only capable of storing two bits in principle.

There is a conceivable multiple-value memory in which the above-mentioned two memory systems are combined together. It will be able to store two bits each in the source end and the drain end (four bits in total) by changing the amount of charge injected into them. In this case the information stored in one end is two bits and the storage of four bits is realized with only four levels. The problem involved in this mode is the way of reading. At the time of reading by the above-mentioned conventional technology, the information in one end adjacent to the information to be read is shielded by depletion in the surface of the silicon substrate in the neighborhood of the charge storage region. This necessitates a drain voltage of certain magnitude. This drain voltage should be proportional to the threshold voltage to be shielded. Consequently, the reading drain voltage should be high for memory of two bits or more, although this is not necessary in the conventional technology for one-bit memory at one end. This causes a problem with the destruction of stored information by the hot carriers which occur during the reading operation. In this case, the reading disturbance is also a problem.

Thus, the object of the present invention is to provide a process for producing a semiconductor memory device which is highly resistant to reading disturbance despites its low cost and its high degree of integration.

According to the present invention, the semiconductor memory has a source region and a drain region, which are formed parallel to each other, and an assist electrode which is between and parallel to the source and drain regions without overlapping, so that it uses, at the time of writing, the assist electrode as the assist electrode for hot electrons to be injected at the source side and it uses, at the time of reading, the inversion layer formed under the assist electrode as the source region or the drain region.

These and other objects and means of the invention will become more apparent in the detailed description and examples which follow.

DESCRIPTION OF THE PREFERRED EMBODIMENTS

The following is concerned with the semiconductor elements and semiconductor devices pertaining to Examples of the present invention.

EXAMPLE 1

Figure 1:
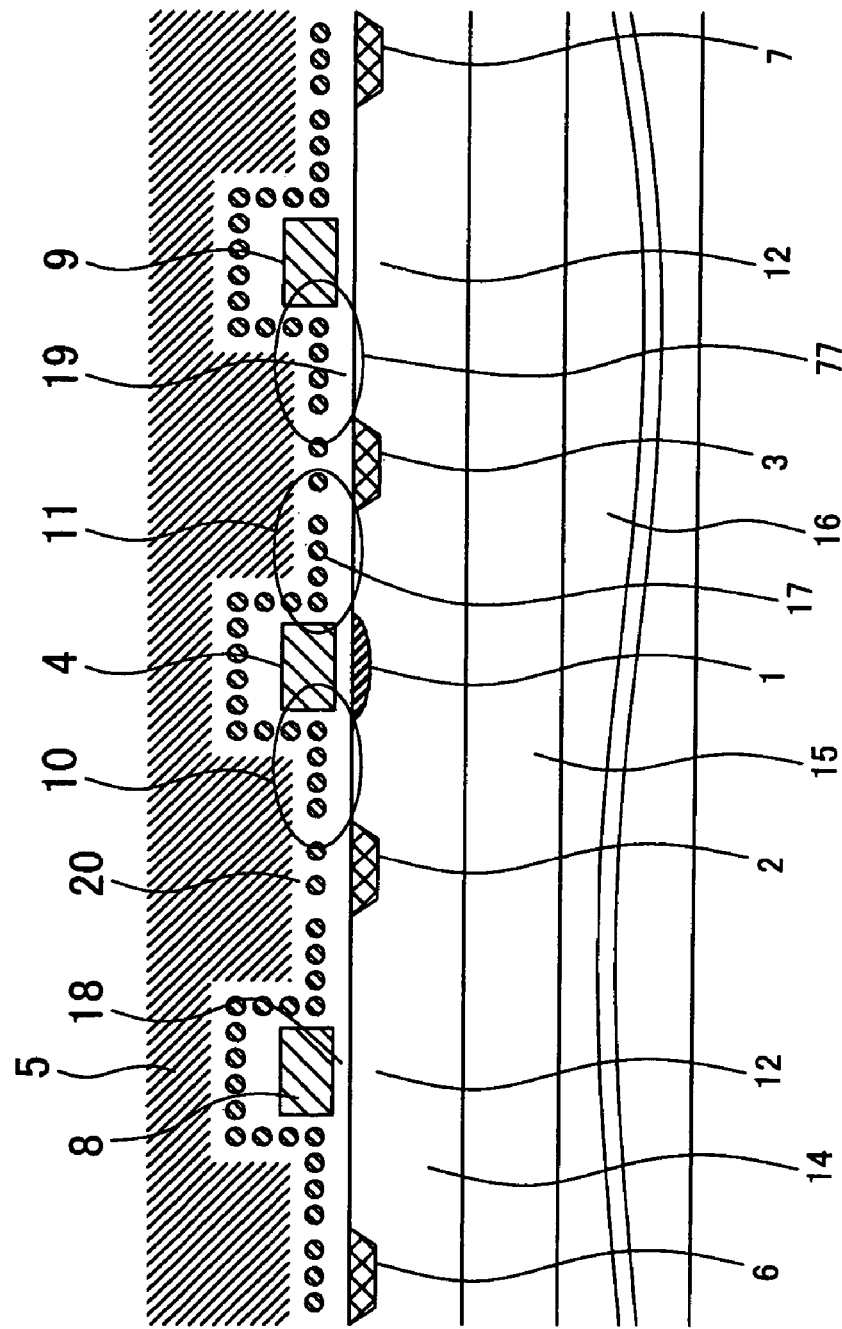
FIG. 1 is a sectional view showing the structure of the memory cell array of the semiconductor memory device in Example 1.

FIG. 1 shows the sectional structure of the memory element pertaining to this Example. The memory element has the triple-well structure composed of a p-type silicon substrate (16), an n-type well region (15), and a p-type well region (14). In the p-type well are formed n-type diffusion layer regions (2, 3, 6, 7). There are assist electrodes (4, 8, 9) of p-type polysilicon which control the potential of the surface of the silicon substrate. There is a control electrode (5) in laminate structure composed of n-type polysilicon and W (tungsten). This control electrode (5) functions also as the word line. On the surface of the silicon substrate is an insulating film (19) of SiO$_2$ which is 8 nm thick. Adjacent to the insulating film (19) are charge storage regions (10, 11) which are composed of fine crystal grains (17) of silicon having an average particle diameter of 18 nm. Between the fine crystal grains (17) of silicon and the control electrode (5) is formed an SiO$_2$ film (20) which is 10 nm thick. Also, between the assist electrodes (4, 8, 9) and the silicon substrate is formed another SiO$_2$ film (18) which is 6 nm thick. These units arranged in a repeated pattern constitute the memory cell array. This sectional structure is characterized by not having the trenches filled with insulating film which are usually formed for element isolation.

There is a difference in impurity concentration between the surface of the substrate under the assist electrodes (4, 8, 9) and the surface of the substrate under the charge storage regions (10, 11).

Figure 2:
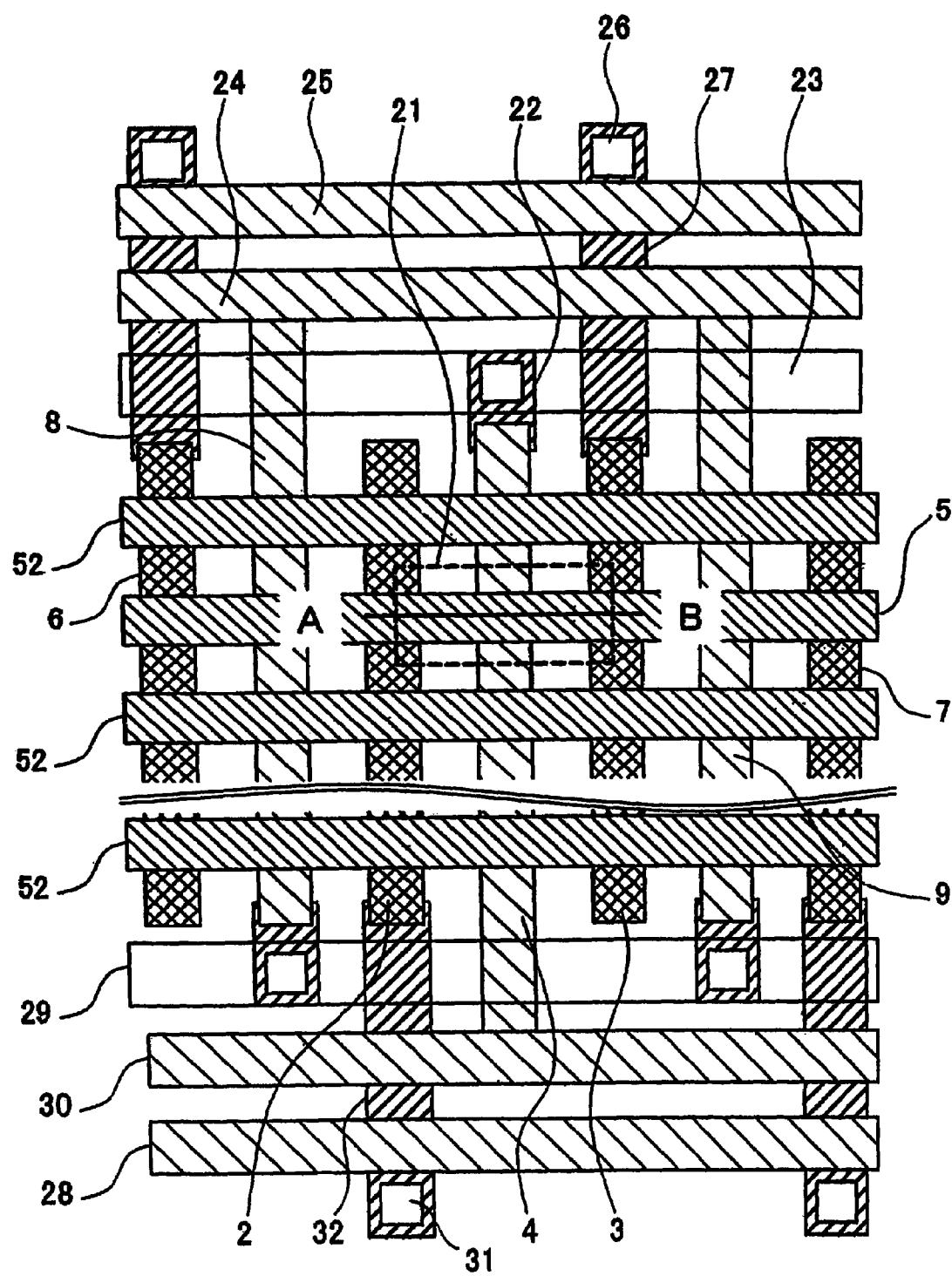
FIG. 2 is a plan view of the memory cell mat of the semiconductor memory device in Example 1.

FIG. 2 is a plan view, in which metal wiring is omitted unless necessary for illustration. The part (21) surrounded by a dotted line represents a unit cell. The cross section taken along the line A-B corresponds to FIG. 1. The structure having 64 word lines arranged in the Y-direction of the diagram constitutes a basic unit (which is referred to as a memory mat hereinafter). At its end, the assist electrodes (4, 8, 9) are bundled alternately (24, 30), so that a voltage can be applied independently to the adjacent assist electrodes. At this end, there is a trench filled with an insulating film for element isolation, so that active regions are separated from each other. The diffusion layers (2, 3) are connected to these active regions (32, 27). There are gate electrodes (28, 25) between these diffusion layers (2, 3) and the contacts (26, 41) to wiring. They constitute the MOS transistor for selection. This selective MOS makes a connection between the local bit lines (2, 3, 6, 7) of diffusion layer and the global data lines (34, 35, 33, 36). To one global data line are connected a plurality of local data lines, and this constitutes the hierarchical data line structure. This structure produces an effect of reducing the capacity to be charged and discharged, increasing the operating speed, and decreasing power consumption. In addition, this structure obviates the necessity of applying a high data line voltage to the memory cell except when writing is performed in a selected memory mat. This leads to a reduction of disturbance passing to unselected cells. Another advantage is that the source line of inversion layer (which has a comparatively high resistance) can be made short in the reading operation (which will be mentioned later). This is effective in increasing the reading speed. Another feature is that there exists a structure in which the assist electrode (4) overlaps with the active region (22) containing an n-type impurity introduced thereinto. The assist electrode (4) and the active region (22) are insulated from each other by the insulating film formed on the surface of the substrate. This active region is connected to the metal wiring (23) through the contact structure. The advantage of this structure is that a potential can be applied to the inversion layer (1) from the metal wiring (23) through the active region (22) when a positive voltage is applied to the assist electrode (4) and the inversion layer (1) is formed in the surface of the substrate under the gate. The assist electrodes on both sides also have a region which overlaps with the region containing an n-type impurity introduced thereinto and the contact structure and wiring (29) to apply a potential to this region.

The memory element pertaining to this Example operates in the following manner. The charge storage regions (10, 11) composed of fine crystal grains (17), which are formed on both sides of the assist electrode (4), store 2 bits with 4-level threshold values for each, so that each unit cell stores 4 bits.

The writing operation is performed in the following manner. It is assumed that information is written in the charge storage region (11) at the right of the assist electrode (4). Table 1 below shows the correspondence between information and threshold level.

TABLE 1

| | Writing word voltage | Range of threshold value (Vth) |
|---|---|---|
| "01" | Vww3 | Vth > V3 |
| "00" | Vww2 | V2L < Vth < V2H |
| "10" | Vww1 | V1L < Vth < V1H |
| "11" | Vww0 | V0L < Vth < V0H |

Figure 3:
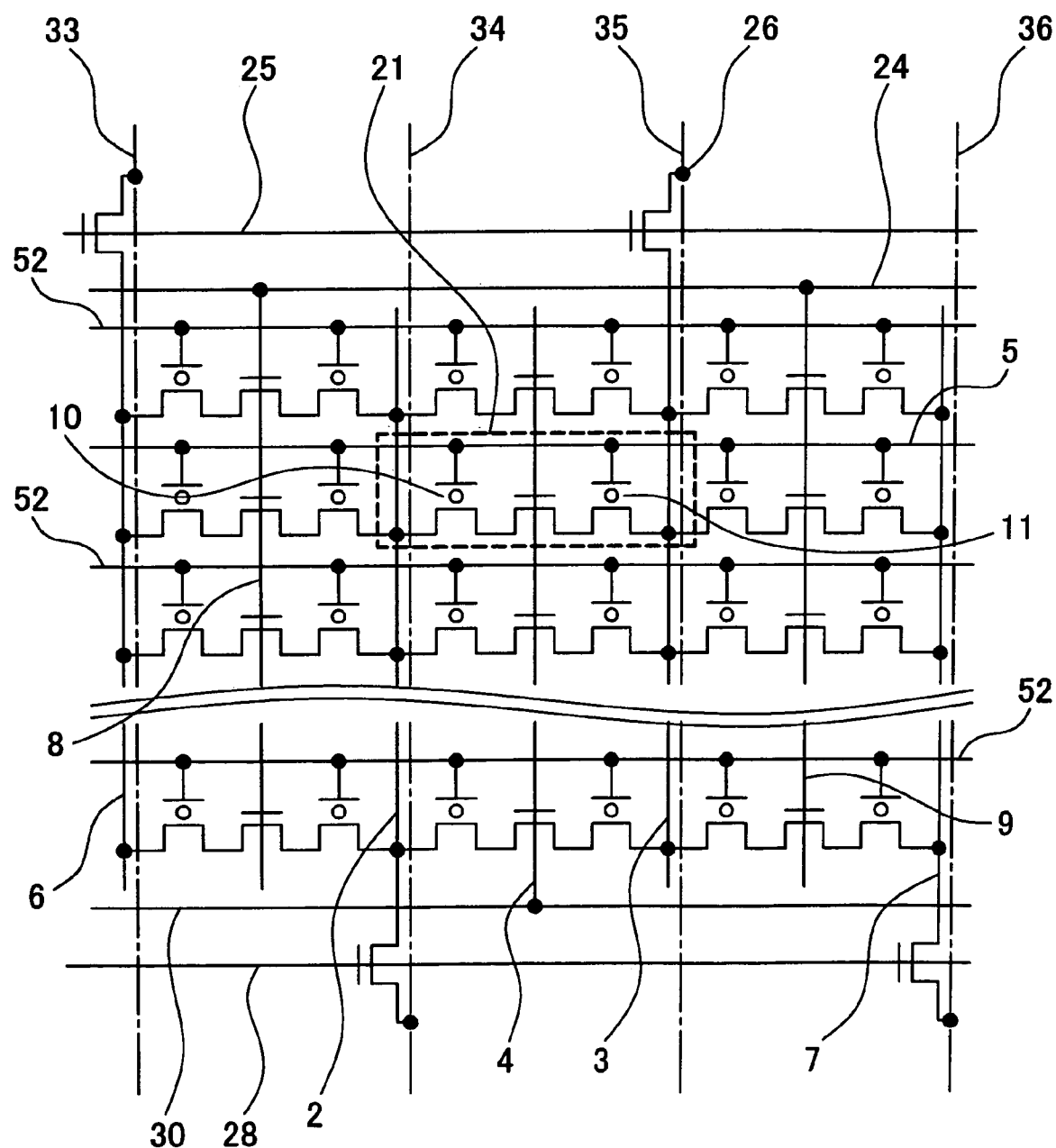
FIG. 3 is an equivalent circuit diagram which shows how writing is accomplished for relevant cells in the memory cell array of the semiconductor memory device in Example 1.

Here, V3>V2H>V2L>V1H>V1L>V0H>V0L. The correspondence between the 2-bit information (such as "0" and "1") and the threshold level may be changed. The order of threshold levels for writing does not matter; however, in this Example, it is assumed that writing is accomplished in the order from high level to low level. If the information to be written in a relevant memory cell is "01", then the diffusion layer 1 (3) is set at a prescribed voltage Vdw, and the diffusion layer 2 (2) at the other end is set at a lower voltage Vsw (say, 0V). To be more specific, the global data lines (34, 35) to which the diffusion layers are connected are set at respective voltages, and if the information to be written in the selecting lines (25, 28) of the transistor for selection of the local data lines is not "01", then the both ends are set at Vsw (say, 0 V). The assist electrode (4) is set at a comparatively low potential Vwa (say, 1 V), so that the substrate surface under the electrode is made conductive with high resistance. The assist electrodes (8, 9) at both sides of the selecting assist electrode (4) are set at a further lower potential Vwan (say, 0.5 V), so that no inversion layer is formed in the substrate surface (12, 13) under the electrode. In this way, the diffusion layers (6, 2) and (3, 7) at both ends of the assist electrode (8, 9) are made non-conductive for electrical isolation. If a writing pulse of high voltage Vww3 (say, 15 V) is applied to the control electrode (5), resistance decreases except for the substrate surface under the assist electrode (4) and hence the electric field concentrates under the right end of the assist electrode (4) in the presence of potential difference between the diffusion layers. The result is the occurrence of hot electrons. The hot electrons are attracted toward the control electrode (5) which has a higher potential, and they jump over the potential barrier of the tunnel insulating film (19) to be injected into the charge storage region (11). At this time, the substrate surface under the assist electrode (4) has a high resistance, and hence current flowing from the diffusion layer (2) to the diffusion layer (3) is not so large. This permits more efficient injection of hot electrons than in the case where there is no assist electrode. If the information to be written is not "01", no potential difference occurs between the diffusion layers (2, 3) and hence no hot electrons occur, and consequently the electron injection does not take place. If the non-selected word line (52) is fixed at a sufficiently low voltage (say, 0 V), so that the channel of the memory cell driven by the non-selected word line is non-conductive, the writing of information is not performed. After that, the reading operation is performed to verify that the threshold value Vth is higher than V3. The details of the reading operation will be mentioned later. If the information to be written is "01" and the threshold value Vth is not higher than V3, the diffusion layer 1 (3) is set again at a prescribed voltage Vdw (say, 4 V) and the writing pulse is applied. After that, a sequence is repeated in which the reading verification operation is performed and the writing pulse is applied if necessary. In this array structure, adjacent cells serve for electrical isolation of elements; therefore, the writing operation is performed on the same side for the assist electrode of every ether cells of a plurality of cells driven by the same word line (5). When all the cells for writing have passed verification, the sequence of writing "01" is completed. Then comes the next sequence of writing "00". In this case, too, if the information to be written in the relevant cell is "00", then the diffusion layer 1 (3) is set at a prescribed voltage Vdw (say, 4 V); otherwise, it is set at the same voltage Vsw (say, 0 V) as that at the other end. The assist electrode (4) is set at the same voltage Vwa (say, 1 V). After that a writing pulse is applied to the word line (5). This voltage Vww2 is 12 V (for example), which is lower than Vww3. Even though the pulse width for this is the same as that used at the time of writing "01", the amount of charge injected is small and hence writing with a lower level of threshold value can be accomplished. Verification is also performed in the same way. The difference is that the threshold value should be set higher than V2L and lower than V2H. In this case, it is set so that the first writing pulse does not inject charge excessively and the second and subsequent pulse widths are set small so as to prevent excessive charge injection. When all the cells for writing have passed through verification, the "00" writing sequence is completed, and there comes the next "10" writing sequence. The "10" writing operation is identical with the "00" writing operation except that the writing voltage Vww1 is lower than Vww2 (say, 10 V) and the range of the intended threshold value is different. After that, the "01" writing sequence is performed and the writing operation for this cell is completed. Writing to the left side (1) of the assist electrode of the same cell may be accomplished by replacing the role of the diffusion layer 1 (3) with the role of the diffusion layer 2 (2). The equivalent circuit for the writing operation is shown in FIG. 3. A single white circle in the circuit diagram represents the charge storage regions (10, 11) which are composed of silicon fine crystal grains (17). Here, the writing of each information is performed in such a way that the voltage of the writing pulse applied to the word line (5) is kept at a constant value throughout the sequence. However, it is possible to complete the writing sequence in a short time by using a pulse train which increases in voltage as the number of times increases.

Figure 4:
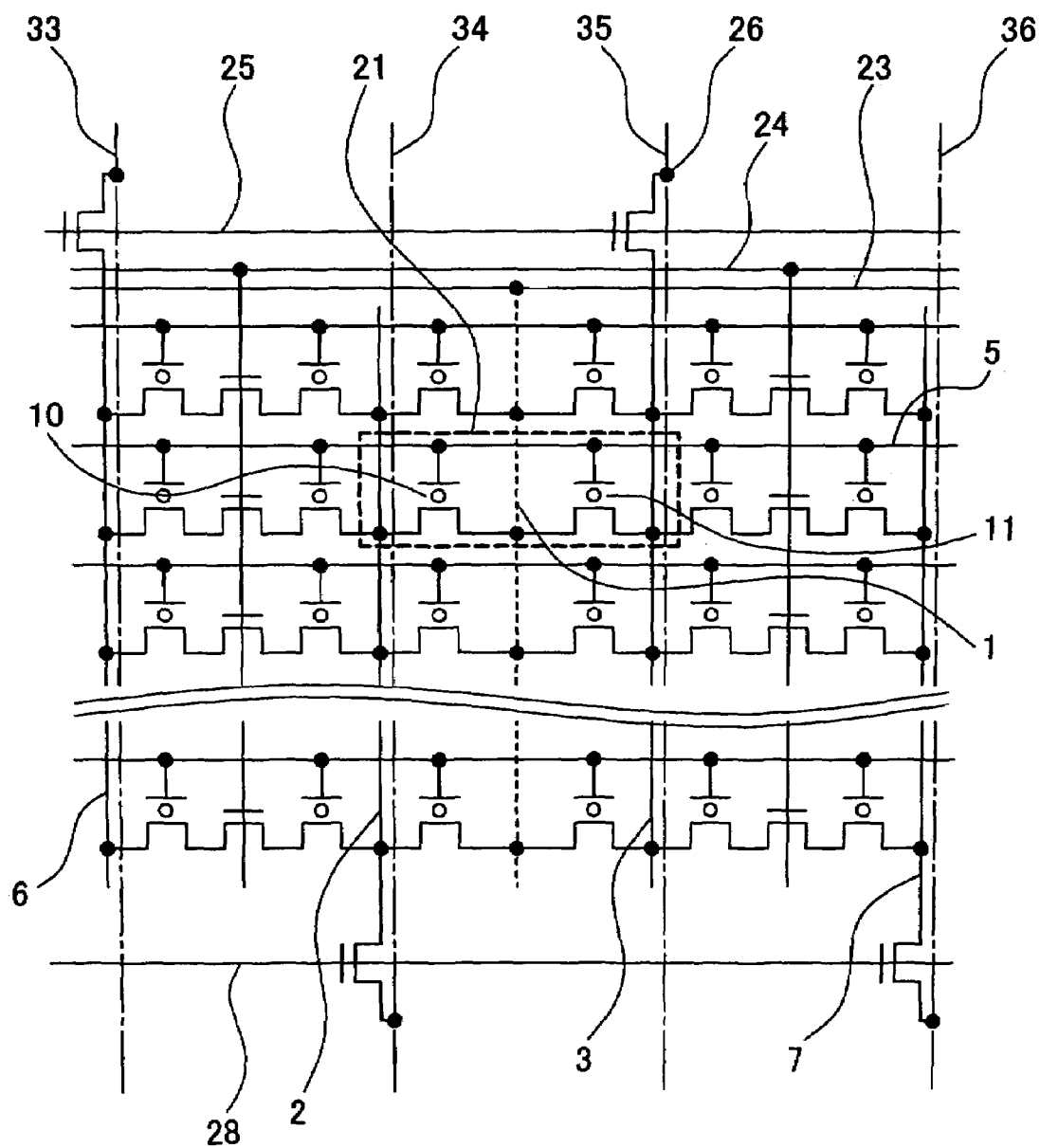
FIG. 4 is an equivalent circuit diagram which shows how reading is accomplished for relevant cells in the memory cell array of the semiconductor memory device in Example 1.
Figure 5:
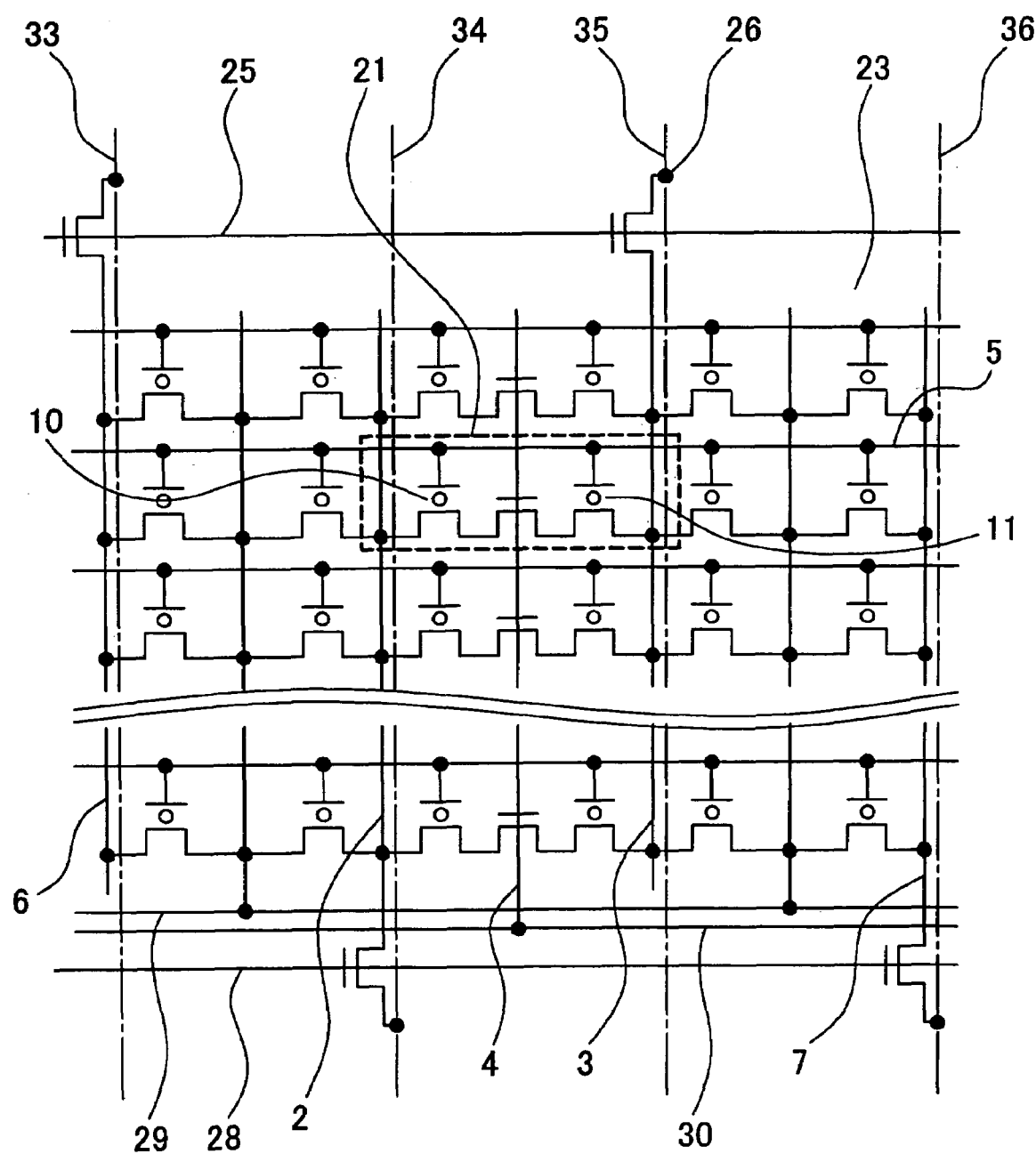
FIG. 5 is an equivalent circuit diagram which shows how reading is accomplished for relevant cells (which are different from those in FIG. 4) in the memory cell array of the semiconductor memory device in Example 1.

In the above-mentioned writing operation, the substrate surfaces (12, 13) under the non-selected assist electrodes (8, 9) serve for electrical isolation of elements. The result is that cut-off cannot be accomplished unless a large negative voltage is used if the threshold voltage is low. On the other hand, the substrate surfaces under the charge storage regions (10, 11) should preferably have a small voltage drop and hence the threshold voltage should preferably be somewhat low. For this reason, the concentration of p-type impurity in the substrate surfaces (12, 13) under the assist electrodes is set higher than that of the substrate surfaces under the charge storage regions (10, 11). Then, the reading operation is explained below. It is assumed that information is read out from the right charge storage region (11) of the assist electrode (4) in which information has been written by the writing operation mentioned above. A prescribed voltage Vs (say, 0 V) is applied to the metal writing (3) for power supply to the inversion layer, and the potential of the assist electrode (4) is set at a potential Va (say, 3 V) which is higher than Vs. Under the assist electrode (4) is formed the inversion layer (1), which has a voltage approximately equal to Vs. The assist electrodes (8, 9) at both sides of the selected assist electrode (4) are set at a potential of Van (say, 0 V) which is low enough for no inversion layer to be formed on the substrate surfaces (12, 13) under the electrode. This establishes electrical isolation between the diffusion layers (6, 2) and (3, 7) at both ends of the assist electrode (8, 9). Reading out four levels necessitates judgment as to whether or not the level is higher than the threshold level "00" (or higher than V2L) or the level is lower than the threshold level "10" (or lower than V1H). The potential of the diffusion layer 1 (3) is precharged at a potential Vdr (say, 1 V), which is higher than Vs, through the global data line (35). The diffusion layer 2 (2) at the other end is set at a lower potential Vdr (say, 0 V). After that, a potential of Vrw1 is applied to the control electrode (5), such that V1H<Vrw1<V2L. If the level of threshold value of the memory is lower than V1H, a state of conduction occurs between the inversion layer (1) and the diffusion layer 1 (3) and hence current flows from the global data line (35) to the metal wiring (23) for power supply to the inversion layer. If it is higher than V2L, a state of non-conduction or high resistance occurs. If the result is lower than V1H, precharging is followed by application of a voltage Vrw0 (where V0H<Vrw0<V11) to the control electrode (5), and a judgment is made for "11" or "10" by using the difference in flowing current. If the result of the first reading is higher than V2L, a voltage Vrw2 (where V2H<Vrw2<V3) is applied to the control electrode (5) after precharging. A judgment is made for "00" or "01" by using the difference in flowing current. In the above-mentioned reading operation, instead of changing the voltage to be applied next according to the result produced by Vrw1, it is possible to perform all the reading operations with Vrw0, Vrw1, and Vrw2 for information reading. The former requires the application of reading voltage only twice and hence is suitable for high-speed reading, whereas the latter requires the reading operation three times but has the advantage of being capable of operation with simple control circuits. In the case where information is read out from the charge storage region (10) at the left of the assist electrode (4), the object is achieved by using the diffusion layer 2 (2) in place the global data line (35) corresponding to it and also the global data line (34) corresponding to it. In this operation system, every other global data lines are driven at the time of reading. By fixing the potential of the global data line at both sides of the global data line to be driven, an electrical shield is formed between the global data lines to be driven, and this leads to a stable reading operation. FIG. 4 shows an equivalent circuit diagram in the reading operation. Connections in this diagram are different from those in FIG. 3, because this diagram equivalently illustrates the fact that the inversion layer (1) is formed under the assist electrode (4) so that wiring is formed by the inversion layers which are electrically connected in the Y-direction on the paper. In this diagram, wiring by the inversion layers is represented by broken lines, and wiring for the assist electrode and wiring for the diffusion layer due to heavily doped impurity are represented by solid lines. Global data lines are represented by chain lines. For the sake of brevity, the equivalent circuit diagram does not show the assist electrode (4) that forms the inversion layer. However, the assist electrodes (8, 9) at both sides are shown in the circuit diagram (as in FIG. 3) because they serve as an element isolator as in the case of writing operation. FIG. 4 is an equivalent circuit diagram representing the reading operation in the relevant memory cell (21). At the time of reading operation for adjacent cells, the assist electrode (4) is set at a low potential Van (say 0 V), so that a state of non-conduction is made between the diffusion layers (2, 3) at both sides, and the assist electrodes (8, 9) at both sides are set at a high potential Va (say, 3 V). As the result, the inversion layers are formed under these assist electrodes; therefore, it should be noted that the resulting equivalent circuit becomes the one shown in FIG. 5 which is different from that shown in FIG. 4. The reading operation mentioned above permits reading as though the cells at both sides of the assist electrode (4) are independent cells. The reading drain voltage may also be set at a low voltage of about 1 V, and this solves the problem with reading disturbance mentioned above in the paragraph of prior art.

Erasure of information is performed on a plurality of cells as a whole which are driven by the same word line. A positive voltage Vew (say, 20V), which is higher than Vww3, is applied to the word line. The charge storage region into which electrons have been injected has a reduced potential, and the interlayer insulating film (20) has a stronger electric field than the tunnel insulating film (19). Consequently, electrons are extracted toward the control electrode (5) and hence the threshold value of the memory cell decreases. Incidentally, erasure may also be accomplished by any other different method. For example, it is permissible to apply a negative voltage (say, −18 V) to the word line so that electrons are extracted toward the substrate. It is also permissible to apply a negative voltage (say, −3 V) to the well (14), to apply a positive voltage (say, 3 V) to the diffusion layers (2, 3, 6, 7), and to apply a negative voltage (say, −13 V) to the word line, so that holes are injected for erasure. In the case of erasure by hole injection, it is possible to select the diffusion layer which is to be set at a negative voltage, thereby erasing only those at both sides thereof. For example, if the assist electrode (3) is selected as the electrode which is to be set at a negative electrode, it is possible to erase the charge storage regions (11, 77) at both sides thereof. Therefore, it is possible to set small the rewriting unit.

Figure 6A:
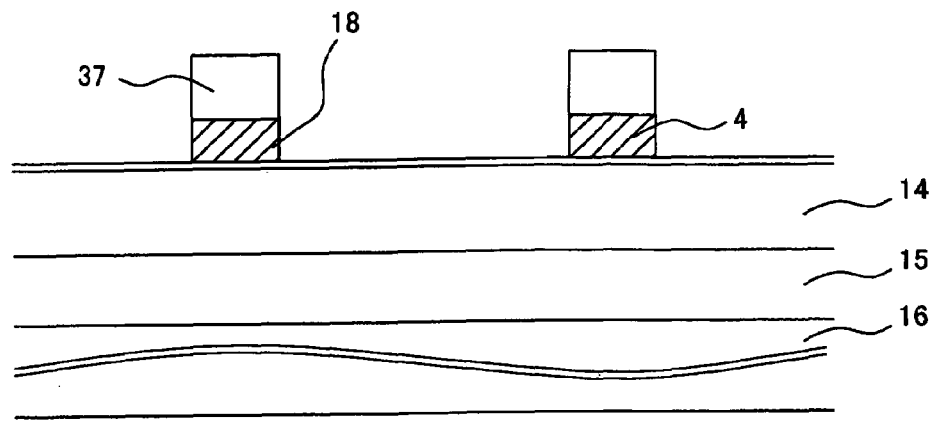
FIGS. 6A-6C are sectional views illustrating the process for producing the semiconductor memory device in Example 1.
Figure 6B:
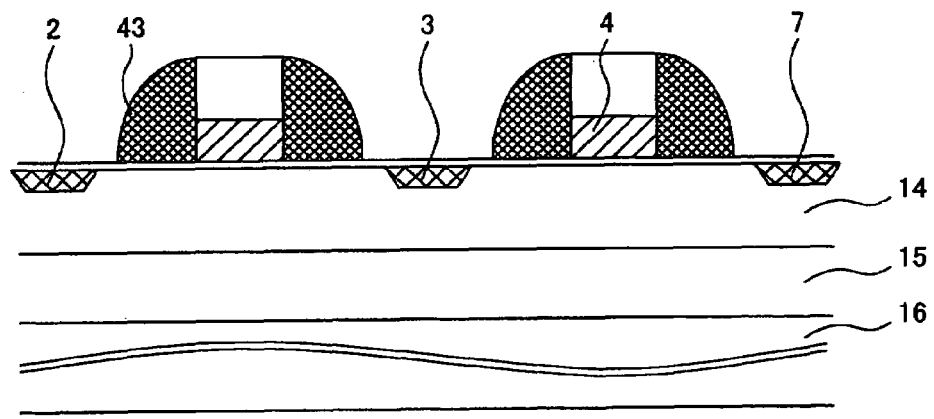
Figure 6C:
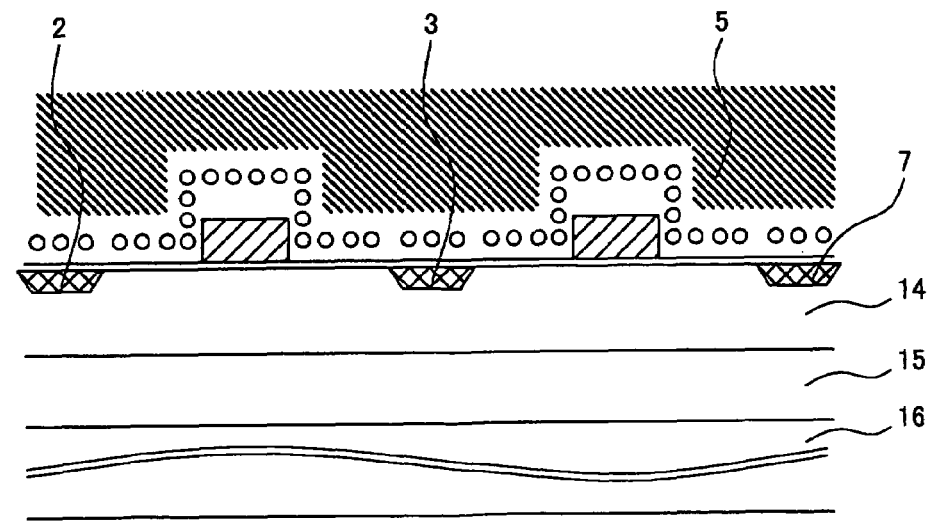
Figure 7A:
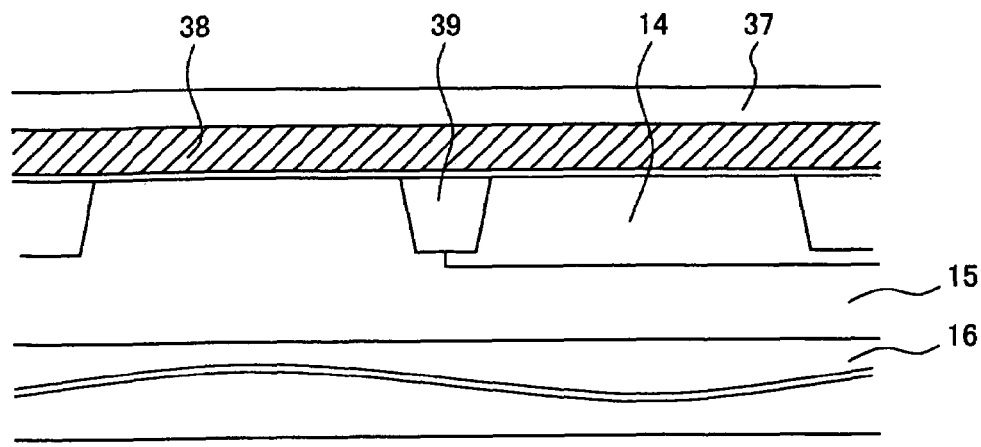
FIGS. 7A-7C are sectional views illustrating the process for producing the semiconductor memory device in Example 1.
Figure 7B:
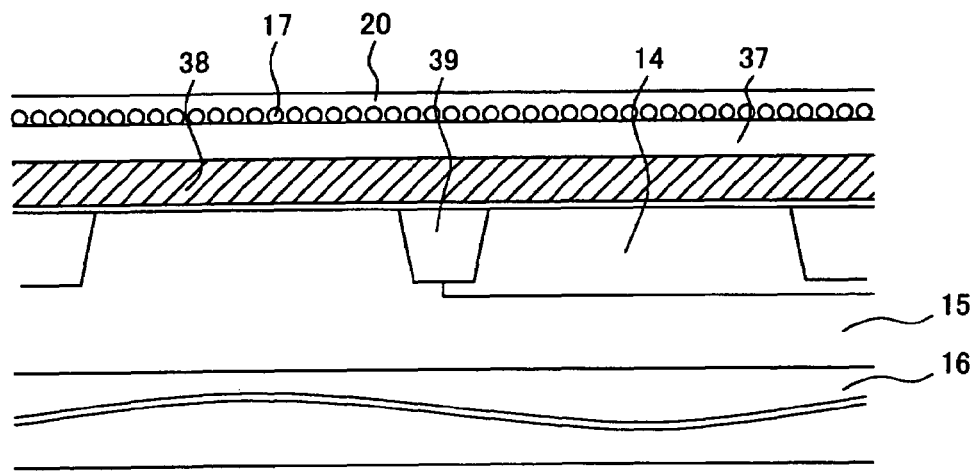
Figure 7C:
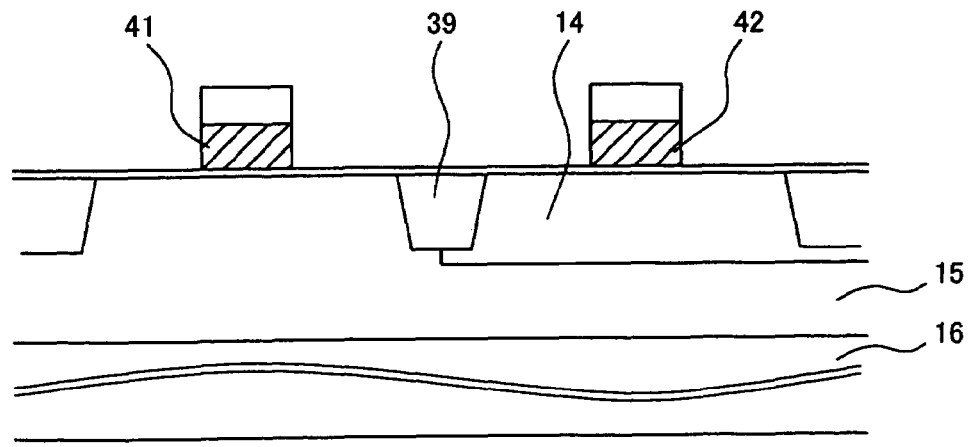
Figure 8:
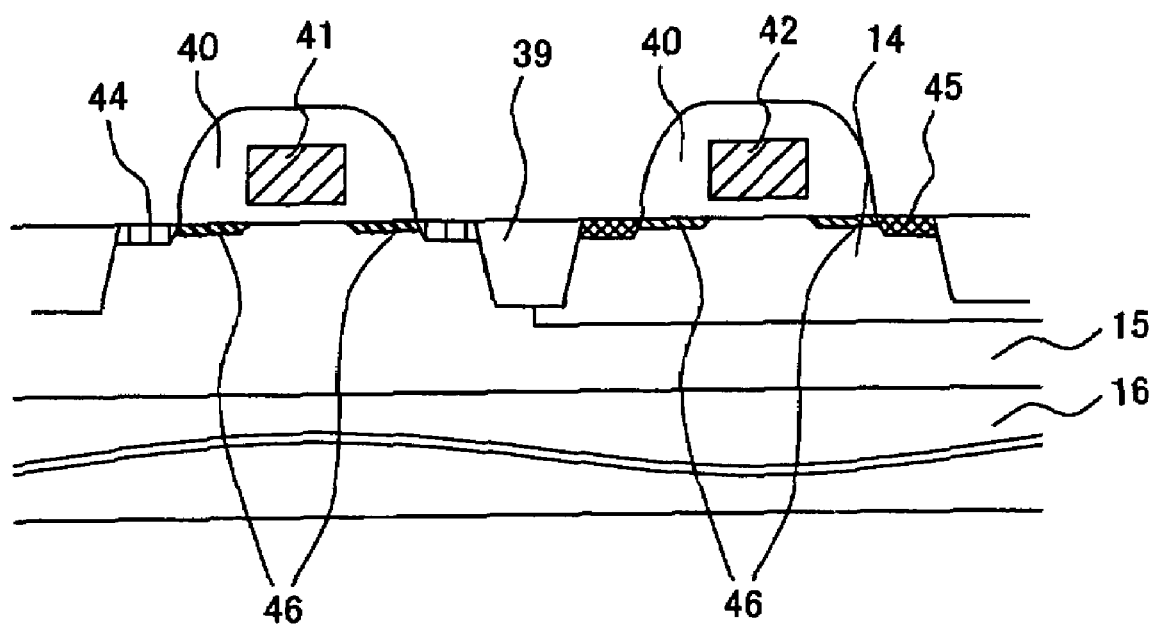
FIG. 8 is a sectional view illustrating the process for producing the semiconductor memory device in Example 1.

The production process in this Example will be explained with reference to FIGS. 6A to 9. FIGS. 6A-6C are sectional views of the memory cell. FIGS. 7A-7C and 8 are sectional views, showing the p-type and n-type transistors in the peripheral circuit. A p-type silicon substrate (16) is used. After an element isolating region (39) has been formed, a deep n-type well (15) is formed and a p-type well (14) is further formed. As is apparent from FIG. 2, there is no element isolating region in the array of memory cells because element isolation in that part is accomplished electrically by the assist electrodes. It exists only at the lead to the contact of each region at the mat end and at the part of peripheral circuit. Ion implantation is performed to adjust the threshold voltage of the peripheral circuit with high voltage resistance, and ion implantation with B (boron) for adjustment of threshold voltage is performed on the region where memory cells are formed. A gate insulating film (20 nm thick) is formed for the transistor with high voltage resistance, and the gate insulating film on the surface of the substrate in the region of memory cells and the region of peripheral circuits with ordinary voltage resistance is removed by using the resist as a mask. The surface of the substrate is oxidized again, so that an $SiO_2$ film (18), which is 6 nm thick, is formed. A non-doped polysilicon film (38) is formed by CVD (Chemical Vapor Deposition), which is to be made later into the assist electrodes (4, 8, 9) and the gate electrodes of the peripheral circuits. P ion implantation and $BF_2$ ion implantation are performed by using the resist as a mask to form the n-type gate region and the p-type gate region, respectively. Further, a CVD-$SiO_2$ film is deposited on the polysilicon film, and the pattern for the assist electrodes (4, 8, 9) is formed by using the resist as a mask. See FIG. 6A. However, at this time, the pattern of the gate electrode for the peripheral circuits is not formed, and it is left covered with the polysilicon film and CVD-$SiO_2$ film. See FIG. 7A. After that, CDV-$SiO_2$ is deposited up to 10 nm, and ion implantation is performed for adjustment of the impurity concentration in the surface of the substrate under the charge storage regions (10, 11) by using this film as the implant through film.

Subsequently, CDV-$SiO_2$ is deposited up to 10 nm and further polysilicon is deposited up to 100 nm. Etch-back is performed to form the polysilicon side wall (43) on the side of the assist electrode. Using this side wall as a mask, As (arsenic) ion implantation is performed to form the n-type diffusion layer regions (2, 3, 7). See FIG. 6B. Dry etching is performed to remove the polysilicon side wall, and then wet etching with HF is performed to expose the surface of the substrate. Subsequently, oxidation up to 8 nm is performed and silicon fine crystal grains are deposited. In the trial product, they have an average particle diameter of 16 nm and a density of $3\times10^{11}/cm^{-2}$. Then, plasma oxidation is performed to oxidize (up to 4.5 nm) the surface of the silicon fine crystal particles. Silicon fine crystal particles are deposited again. In this way it is possible to form fine crystal grains in high density without contact with one another, and they store more electrons under the same writing conditions. This leads to stable characteristics with a broader margin between one stored information and another. In this example, deposition is performed twice, however, it is permissible to repeat plasma oxidation and fine crystal grain deposition as many times as required. Unlike thermal oxidation, plasma oxidation does not promote oxidation more than radical intrusion. Therefore, it has no possibility that the initially formed crystal grains are made very small and the tunnel insulating film is made thick by repeated plasma oxidation. After that, CVD-$SiO_2$ (as the interlayer insulating film) is deposited up to 12 nm. A polysilicon film (doped in n-type) and a W (tungsten) film are deposited to form a double-layer structure. Using the resist as a mask, etching is performed to form the word line (5). See FIGS. 6C and 7B. Using the resist as a mask, etching is performed on the polysilicon film (38) in the region of peripheral circuits, the dots (17) on the laminate structure of CVD-$SiO_2$, and the interlayer insulating film (20) thereon. After that, using the resist as a mask, the gate electrodes (41, 42) of the transistors of the peripheral circuit are formed. See FIG. 7C. Using this gate pattern and the resist as a mask, ion implantation is performed to form a shallow p-type region (47) in p-MOS and a shallow n-type region (46) in n-MOS.

CVD-SiO$_2$ is further deposited, and etch back is performed to form the side wall (40). Using this side wall (40) and the resist as a mask, ion implantation is performed to form a p-type diffusion region (45) in p-MOS and an n-type diffusion region in n-MOS (44). See FIG. 8. An interlayer film is deposited and planarization is performed, and the contact process and wiring process are performed.

In this example, the well (14) is of p-type and the carrier is electrons. However, it is also possible to use an n-type well and to use holes as the carrier. In this case, the relation of the voltage magnitude is reversed. This holds true in other Examples.

The charge storage region in this Example is composed of a large number of silicon fine crystal grains unlike the conventional flash memory. Like a memory cell of a flash memory, the charge storage region at one place may be formed from polysilicon. (In this Example, polysilicon memory nodes are formed at two places (10, 11).) This will be mentioned in later Examples. Although silicon fine crystal grains are used in this Example, they may be replaced by fine particles of other semiconductor or metal. It is also possible to use fine particles of an insulator having charge traps. The advantage of using fine particles as in this Example is that the memory nodes are isolated from one another and hence it is not necessary to separate them by fabrication as in the case of memory nodes in the conventional flash memory. This facilitates processing and increases process margin. The same object (easy processing) can be achieved even when an insulating film of SiN with traps is used; therefore, it can be used. SiN permits etching with a selective ratio relative to SiO$_2$; therefore, it is superior in processability to the charge storage region of fine particles. On the other hand, it is possible to surround the charge storage region of fine particles with another insulating material such as SiO$_2$ having no traps; therefore, it is usually possible to select a material which hardly permits charge movement between fine particles. This leads to good retention characteristics. Therefore, it is suitable for multiple-value memory with a small threshold value margin. Consequently, it is suitable for the application like this Example in which more than one piece of information is stored by means of the amount of injected charge and the variation of characteristic properties should preferably be minimized. Also, in this Example, an SiO$_2$ film is used as the interlayer film (5) of the charge storage regions (10, 11) and the control electrode (5); however, it may be replaced by an SiO$_2$ film incorporated with nitrogen. As compared with a simple SiO$_2$ film, it is less liable to form traps at the time of rewriting and less subject to variation in characteristic properties. It may also be replaced by a laminate film composed of an SiO$_2$ film and a silicon nitride film. The advantage of this laminate film is that it impedes current flow when an intense electric field is applied, and this leads to a high reliability of memory elements. In this case, erasing operation should be performed by extracting toward the substrate rather than extracting toward the control electrode. Rapid erasing is accomplished in this manner. The foregoing relating to the construction of the charge storage region and the construction of the interlayer film is also applicable to all other Examples.

EXAMPLE 2

Figure 9:
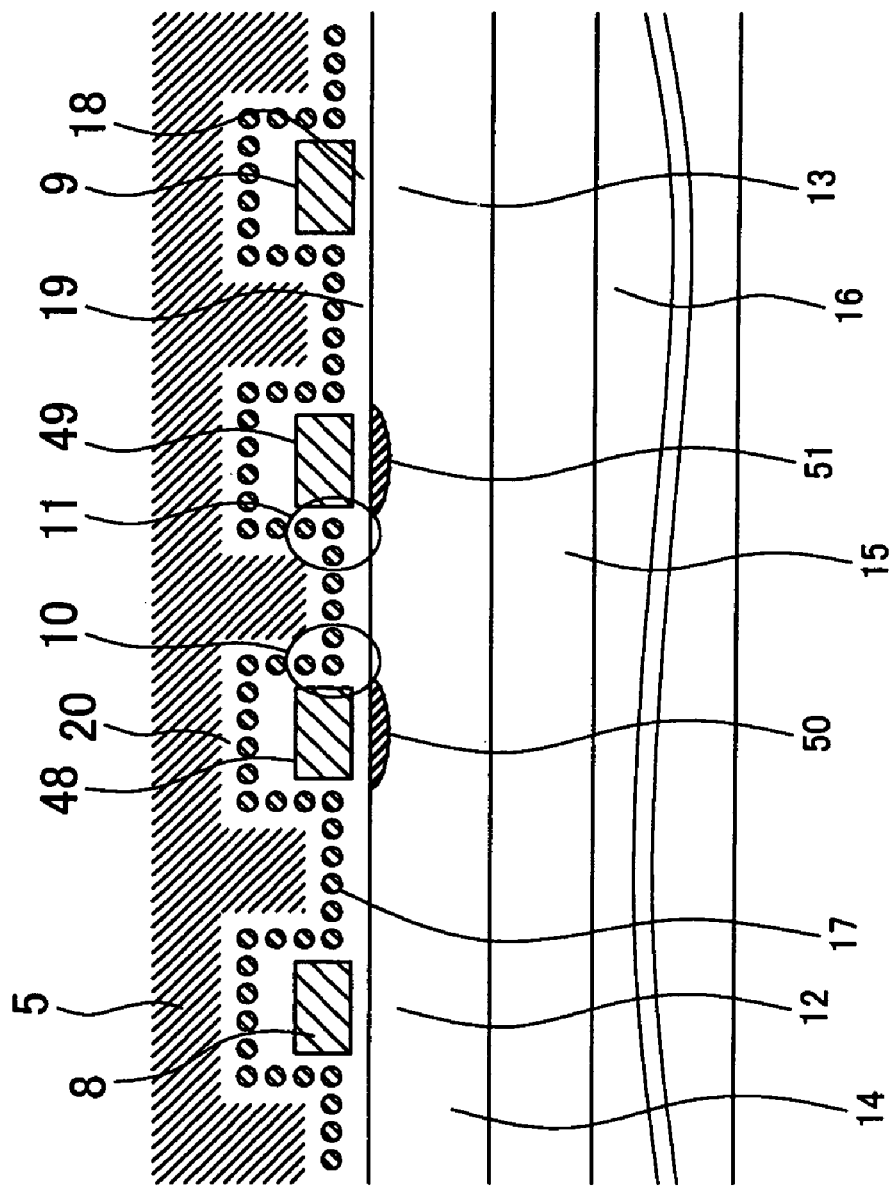
FIG. 9 is a sectional view showing the memory cell array of the semiconductor memory device in Example 2.

FIG. 9 shows Example 2 of the present invention. Example 2 is identical to Example 1 in cell structure except that the diffusion layer regions (2, 3, 6, 7) do not exist in the memory cell. Those parts which are identical in structure and function throughout the two examples are indicated by the same reference numerals. However, in the description of operation, the assist electrodes (48, 49) and the inversion layers (50, 51) are indicated by the reference numerals which are different from those in FIG. 1.

Figure 10:
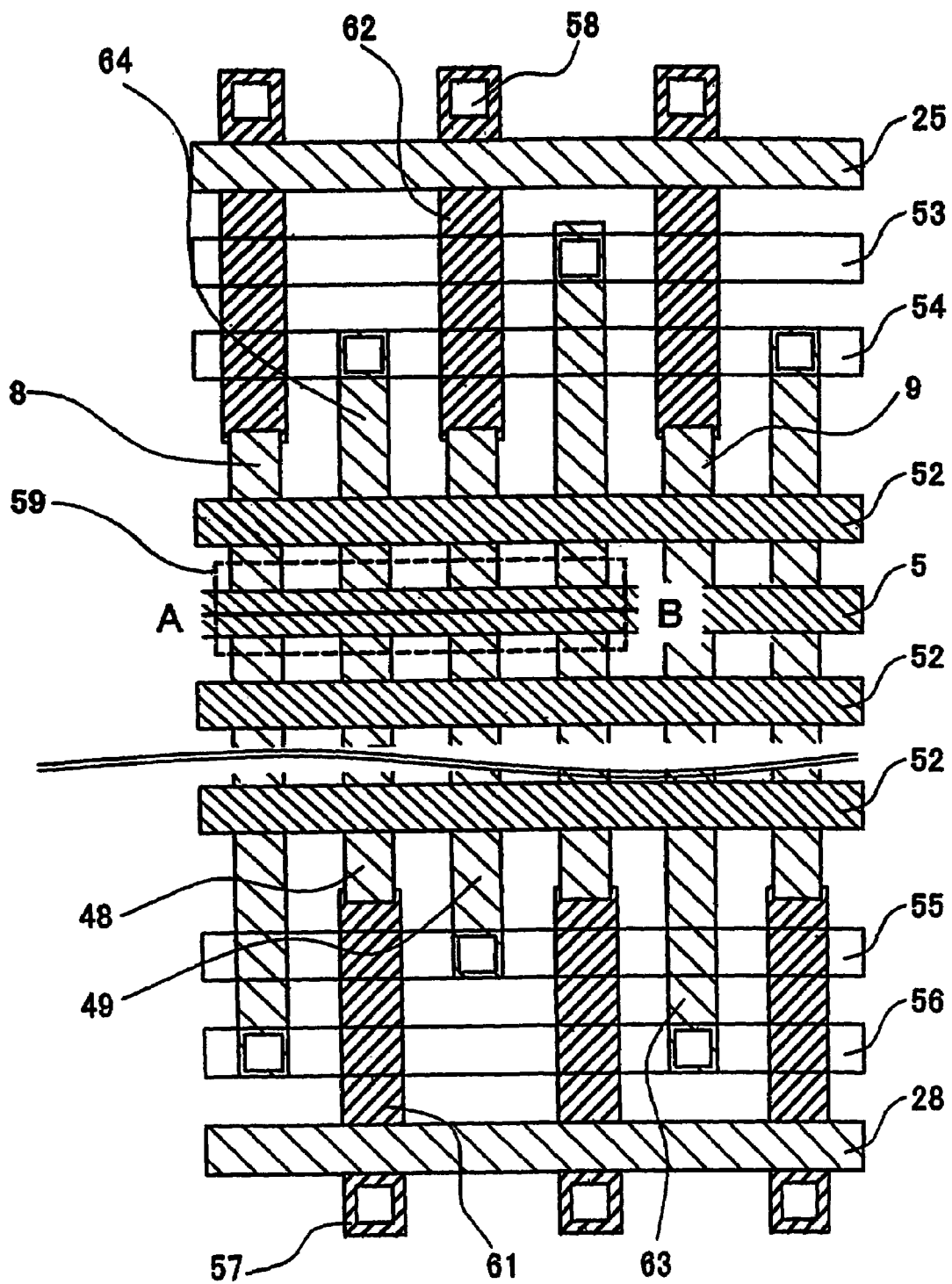
FIG. 10 is a plan view showing the memory cell mat of the semiconductor memory device in Example 2.
Figure 11:
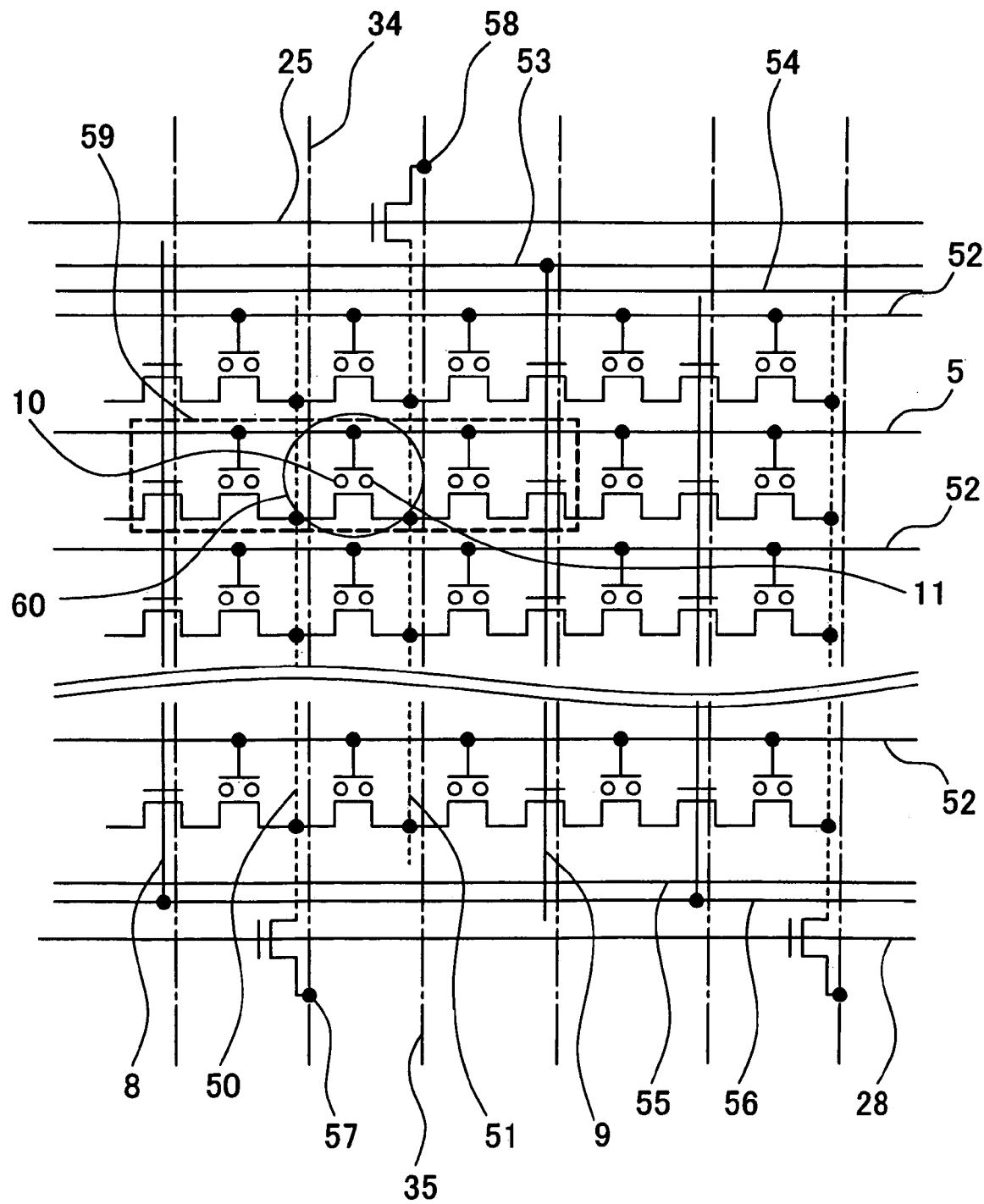
FIG. 11 is an equivalent circuit diagram which shows how to drive relevant cells in the memory cell array of the semiconductor memory device in Example 1.

The operation in this example is illustrated with reference to FIGS. 9, 10, and 11. FIG. 10 is a plan view of the memory mat. The cross section of the square region (59) surrounded by a broken line corresponds to FIG. 9. As in Example 1, wiring (such as global bit line) unnecessary for explanation is omitted. The equivalent circuit diagram corresponding to FIG. 10 is shown in FIG. 11. Example 2 is identical to Example 1 in that the inversion layer formed by voltage application is used as wiring; however, the assist electrodes (48, 49) to form the inversion layer are omitted in the equivalent circuit diagram.

The writing operation is explained first. A positive voltage is applied to the assist electrodes (48, 49) at both sides of the cell (60) in which writing is to be made, so that the inversion layers (50, 51) are formed in the surface of the substrate under them. The adjacent assist electrodes are set at a low voltage (say, 0 V) which is low enough not to form the inversion layer, so that elements are electrically isolated. When the inversion layer is formed, the n-type diffusion layer regions (61, 62) conduct to the inversion layer, so that it is possible to apply a voltage to the global data lines (34, 35) through the contacts (57, 58) formed in the diffusion layer region. Between the adjacent assist electrodes, 4-bit information is stored at two places (10, 11). For the writing of information in the memory node near the assist electrode (48) at one end, this electrode (48) is set at a voltage (say, 2 V) which is high enough to form the high-resistance inversion layer. The data line (34) to supply voltage to the inversion layer (50) under this electrode is set at 0 V. The data line (35) to supply voltage to the inversion layer under the assist electrode (49) at the other end is set at 4 V. The corresponding assist electrode (49) is set at a voltage (say, 7 V), which is sufficiently higher than the set voltage (4 V in this case), so that a low-resistance inversion layer is formed. When a high voltage pulse (say, 15 V) is applied to the control electrode (5) under this state, the electric field concentrates at the boundary between the inversion layer (50) under the assist electrode (48) at one end and the inversion layer under the control electrode (5), thereby giving rise to hot electrons. The thus generated hot electrons are attracted by the control electrode (5) toward the electric field in the direction perpendicular to the control electrode (5), and they burst into the neighboring memory node (10). In this situation, the inversion layer (50) under the assist electrode (48) at one end has a high resistance and hence the current flowing along the wiring (50, 51) of the inversion layer is not so large. Thus, the amount of electrons to be injected into the memory node can be made large relative to the current that flows. This means that there is no possibility of current becoming excessively large at the time of writing in a large number of cells. This is desirable for files to and from which a large number of bits are input and output at one time. Example 2 is identical to Example 1 in that more than one pulse of the control electrode is used according to the threshold value level to be written and writing is performed while verification is being performed. In the case where it is driven by the selective word line and the selective assist electrode pair and injection of electrons is not desirable because writing has been completed or the cell is not the one in which the threshold value level is not to be written, the voltage to be supplied to the diffusion layer (51) is made equal to that of the diffusion layer (5) at the other end, so that the occurrence of hot electrons is prevented. In the case where it is desirable to write information in the other end (11) of the cell, the object is achieved by replacing the settings of the assist electrodes (48, 49), the data lines (34, 35), and the inversion layer wirings (50, 51). In the case of this constitution, the assist electrodes (8, 9) at both sides of the assist electrode pair (48, 49) constituting the relevant cell is used for element isolation at the time of writing and reading; therefore, it is possible to make active its adjacent assist electrode (63). In other words, it is possible to operate the three assist electrodes as one set; however, it is convenient to operate the four assist electrodes as one set from the stand point of use and control. In this case, therefore, control is performed on the four assist electrodes as one set. Consequently, unlike Example 1, the assist electrodes (48, 49, 8, 9, 63, 64) are made into bundles (53, 54, 55, 56) for every four units. As in Example 1, this example also employs the hierarchical data line structure. Therefore, it produces the same effect as in Example 1, and it also produces a new effect at the time of writing operation. The hierarchical design permits the inversion layer formed under the assist electrode to be short. This reduces the variation of voltage effect that depends on the position. Moreover, the voltage effect itself is small and hence it is only necessary to apply a small voltage to the inversion layer at the time of writing.

Next, the reading operation will be explained. Unlike Example 1, the equivalent circuit diagram in this example does not differ depending on writing and reading. The potential difference between the inversion layer wirings (50, 51) is larger than that in Example 1. For the reading of information in the left memory node (10), the left inversion layer wiring (50) is set at a potential Vsr (say, 0 V) and the right inversion layer wiring (51) is set at a higher potential Vdr (say, 3.5 V). Reading pulses Vwr0~Vwr2 (where Vwr0<Vwr1<Vwr2) are applied to the control electrode (5), so that a channel is formed between the left inversion layer wiring (50) and the right inversion layer wiring (51). The Vwr2 is set up so that Vwr2−V0L−Vrd<0 is satisfied. This creates pinch-off on the surface of the substrate under the right memory node (11) regardless of the reading pulse voltage. As the result, the current flowing from the left inversion layer wiring (50) to the right inversion layer wiring (51) is affected very little by the information held by the right memory node (11). This makes it possible to read only the information in the left memory node (10). To read the information stored in the right memory node, it is only necessary to replace the set potential in the left inversion layer wiring (50) with that in the right inversion layer wiring (51).

As in Example 1, erasure is accomplished by each word line. A positive or negative voltage is applied to the word line so that injected electrons are extracted toward the control electrode side or substrate side by Fowler-Nordheim tunneling current.

In this example, 2 bits with 4 threshold value levels are stored in the left memory node (10) and 2 bits with 4 threshold value levels are stored in the right memory node (11); however, this may be modified such that one bit each is stored in the memory nodes, as a matter of course. It is also possible that information is stored in either of the two places between the adjacent assist electrodes (48, 49) instead of both of them. According to the memory structure of this example, the diffusion layer wiring based on impurity does not exist in the memory array, and this makes it possible to reduce the pitch between the assist electrode wirings. This leads to a low-price memory with a small memory cell area.

EXAMPLE 3

Figure 12:
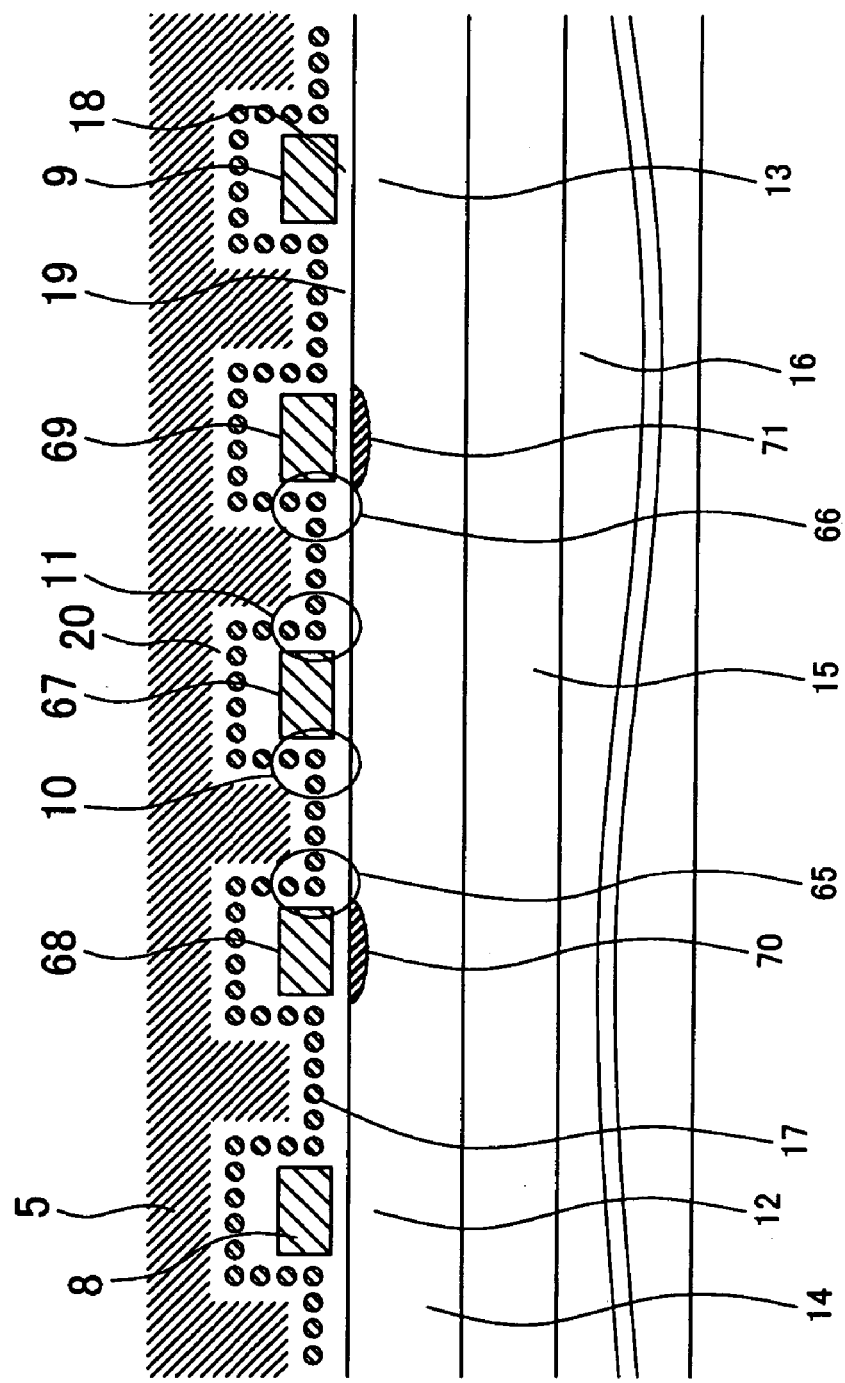
FIG. 12 is a sectional view showing the memory cell array of the semiconductor memory device in Example 3.
Figure 13:
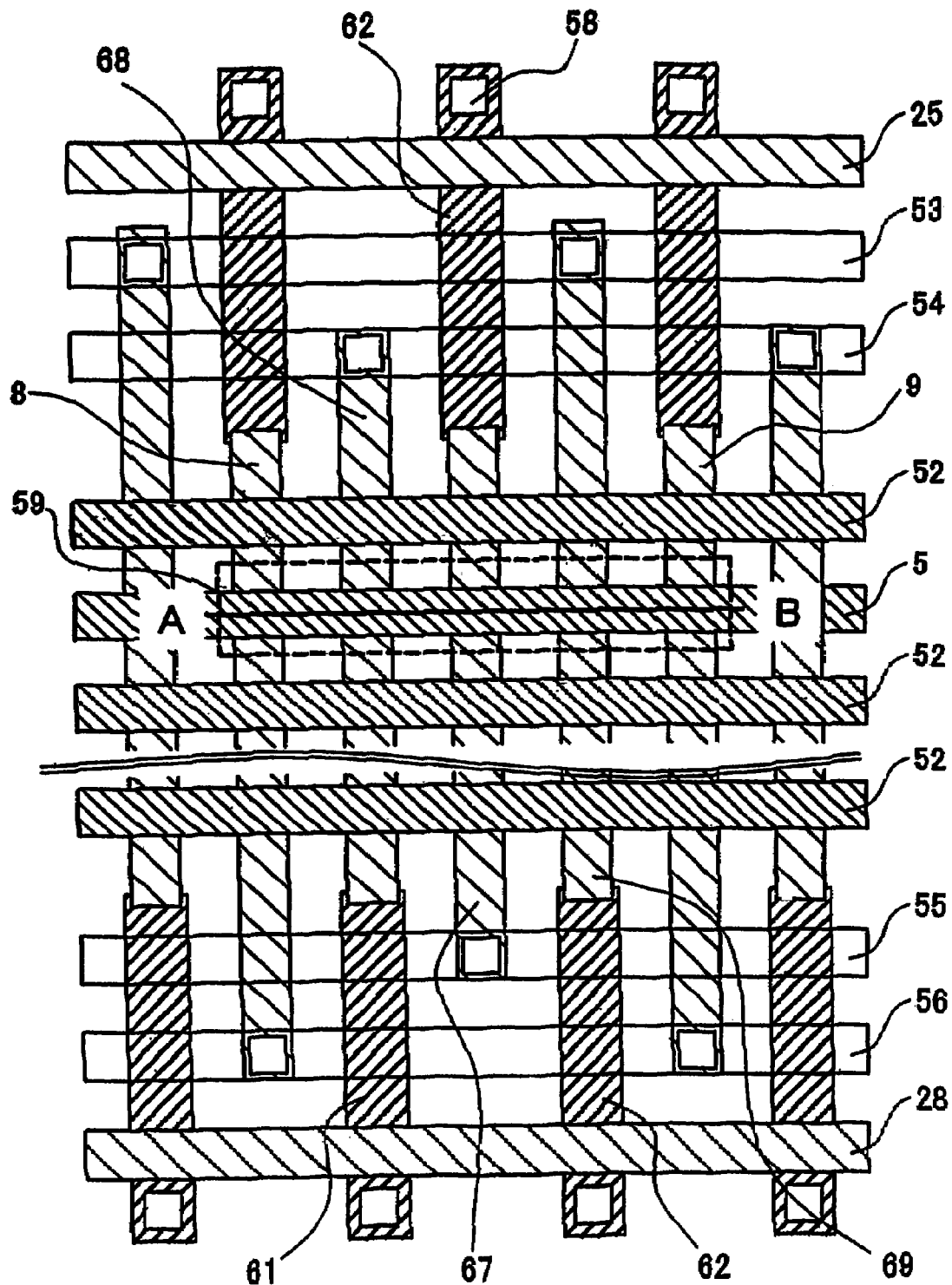
FIG. 13 is a plan view showing the memory cell mat of the semiconductor memory device in Example 3.
Figure 14:
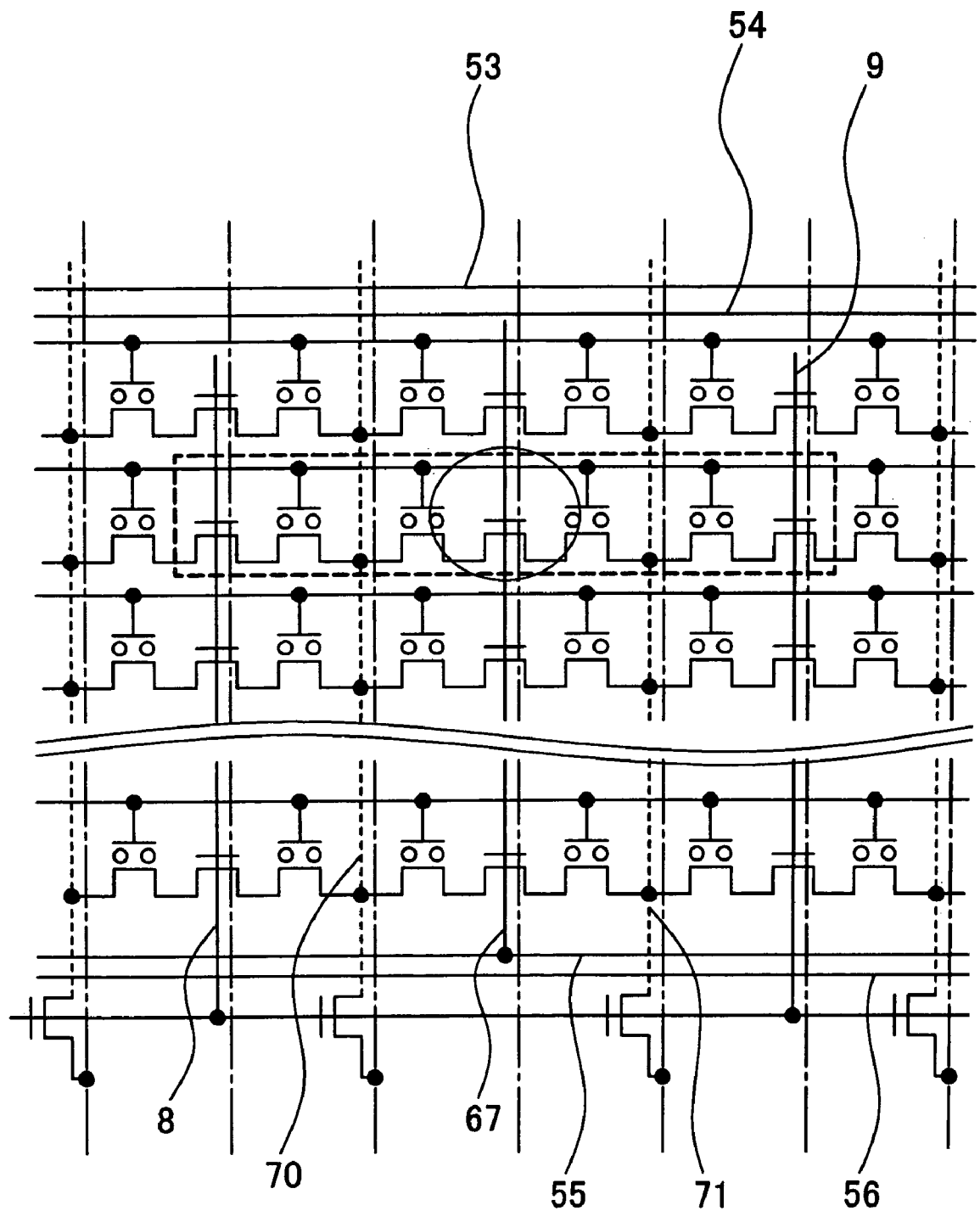
FIG. 14 is an equivalent circuit diagram which shows how writing is accomplished for relevant cells in the memory cell array of the semiconductor memory device in Example 3.

The third example of the present invention will be explained with reference to FIGS. 12 to 14. FIG. 12 is a sectional view showing the structure. FIG. 13 is a plan view. FIG. 14 is an equivalent circuit diagram at the time of writing. This example is identical to Example 2 in the sectional view and plan view of the array part. However, the two examples differ in the way of operation; therefore, they differ in the equivalent circuit representing operation. Reference numerals are given to those parts which need explanation. This example makes it possible to reduce writing variation more than Example 2.

This example greatly differs from Example 2 in the writing operation. In Example 2, writing operation is performed between the adjacent assist electrodes (48, 49) and the assist electrodes (8, 9) adjacent to them serve for element isolation; however, this example differs from Example 2 in that the writing operation is accomplished by the adjacent three assist electrodes (67, 68, 69). Positive voltages (say, 3.5 V and 7 V) are applied respectively to the assist electrode lines (70, 71) at both ends of the three assist electrodes as one set, so that the inversion layers (70, 71) are formed under the assist electrode. These inversion layers (70, 71) receive power from the diffusion layers (61, 62) at the end of the memory mat. Unlike Example 2, this example does not need to set the other inversion layer (70) high in resistance. The inversion layer (70) at one end and the inversion layer (71) at the other end may be regarded respectively as the diffusion layer (2) at one end and the diffusion layer (3) in other end in Example 1. Also, the assist electrode (67) at the center may be regarded as the assist electrode (4) in Example 1. Then, the writing operation may be carried out in the same way as in Example 1, and hence information can be stored in the memory region (11) at the right of the central assist electrode (67). For writing in the memory region (10) at the left of the central assist electrode (67), it is only necessary to replace the voltage setting in the assist electrodes (68, 69) at both ends with the voltage setting in the inversion layers (70, 71) at both ends. Moreover, writing operation is also possible in which the assist electrodes (68, 69) used as the assist electrodes at both ends in the above-mentioned operation are used as the central assist electrode. It is possible to perform writing in the right region (65) by using (68) as the central electrode, and it is also possible to perform writing in the left region (66) by using (69) as the central electrode. As the result, it is possible to perform memory operation in two places between the adjacent assist electrodes (67, 68; and 67, 69), as in Example 2. In Example 2, writing operation is performed such that the low-potential inversion layer (say, 50) is set high in resistance and the electric field is concentrated at this end. This poses a problem that the resistance value varies depending on the distance from the diffusion layer (61) of the cell. In this example, the pattern dependence is insignificant because a high-resistance region is formed by the central electrode.

Reading and erasing operation may be accomplished in the same way as in Example 2, and the equivalent circuit diagram is identical to that shown in FIG. 11.

Figure 25:
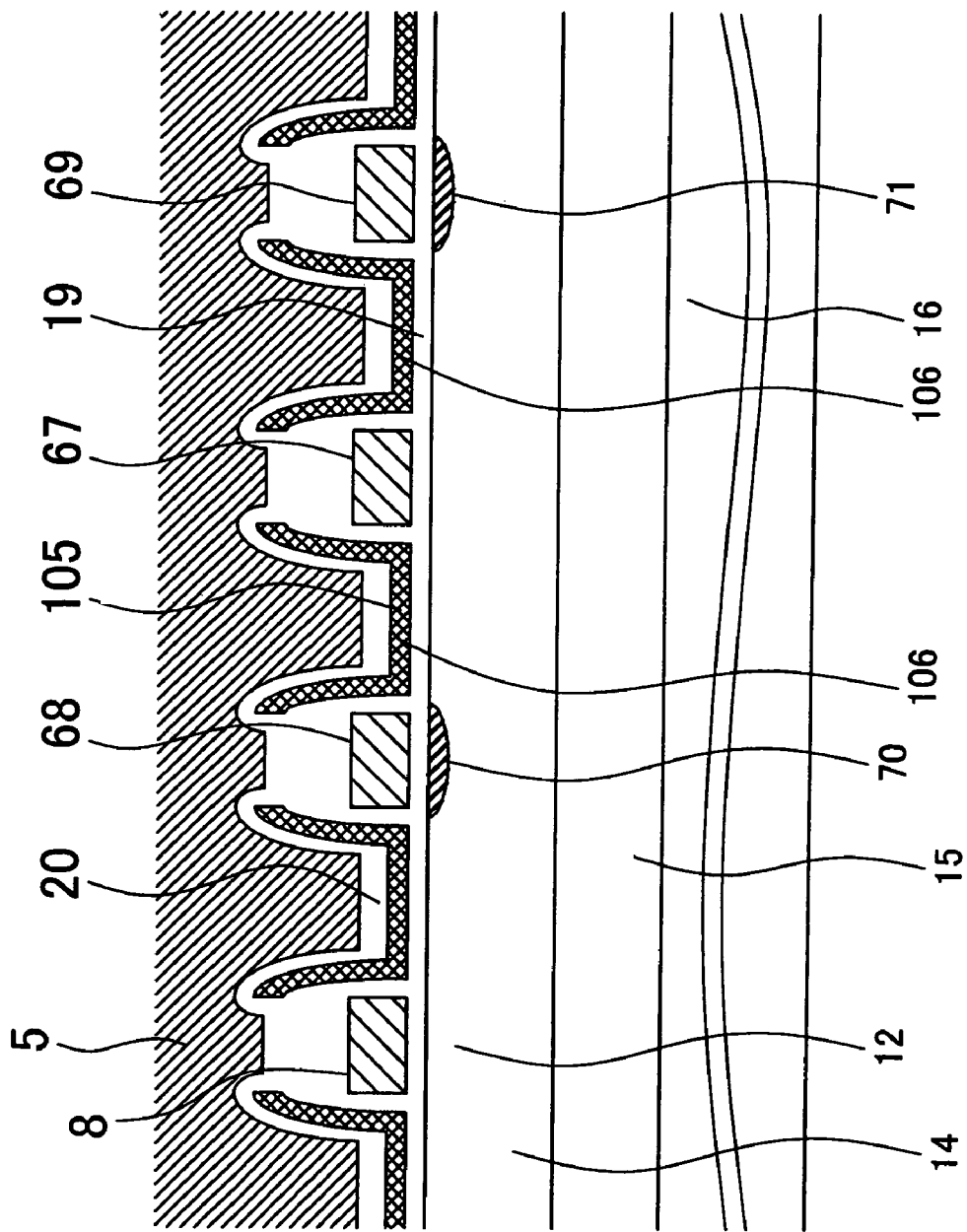
FIG. 25 is a sectional view showing the structure of the charge storage region which is a continuous film of n-type polysilicon.

FIG. 25 shows a structure according to this example in which the charge storage region is formed from n-type polysilicon film (105, 106). This structure is identical to the one in Example 2 in that the adjacent three assist electrodes (67, 68, 69) are involved in writing. In this structure, it is impossible to form two storage places between the adjacent assist electrodes; however, the charge storage regions (105, 106) have a high degree of freedom in structure and hence it is easy to design the control electrode (5) and the charge storage regions (105, 106) having a large static capacity. This leads to a large latitude of variation in the potential of the charge storage regions (105, 106) which results from voltage application to the control electrode (5). The result is high-speed writing and erasing operation and decreased voltage. The large reading current that can be employed also contributes to high-speed reading. Moreover, since the electric field applied to the interlayer film (20) is weak, current hardly flows into the interlayer film and hence the interlayer film is very little subject to deterioration.

EXAMPLE 4

Figure 15:
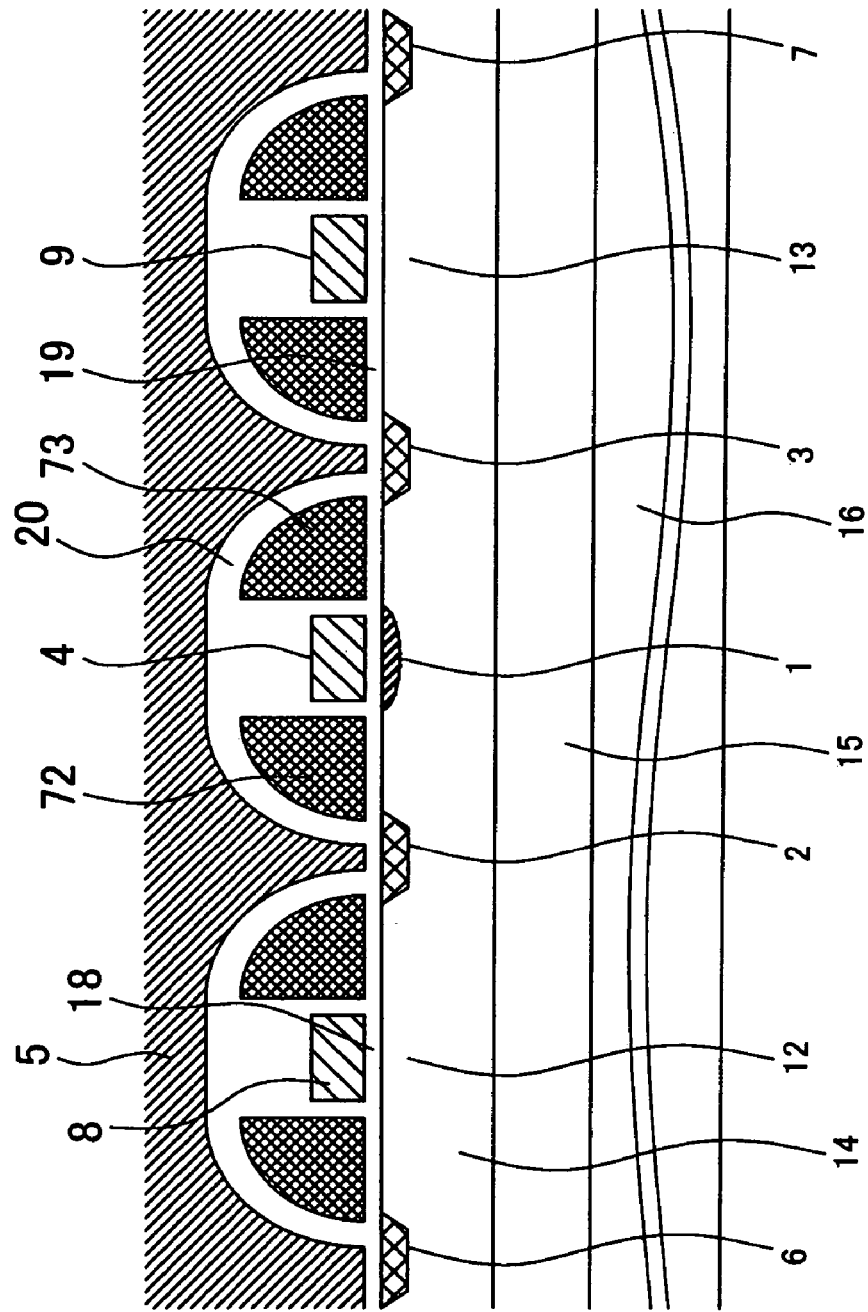
FIG. 15 is a sectional view showing the structure of the memory cell array of the semiconductor memory device in Example 4.

FIG. 15 shows the fourth example of the present invention. It is a sectional view corresponding to FIG. 1 in Example 1. Although the structure of the memory node and the erasing operation are different from those shown in FIG. 1, other structures are identical in function and operation to those shown in FIG. 1. In this example, the memory node is formed from polysilicon fabricated into the side walls of the assist electrodes (4, 8, 9) instead of being formed from fine particles (10, 11) as in Example 1. The side walls (72, 73) vary in height depending on the thickness of the polysilicon film of the assist electrodes (4, 8, 9) and the thickness of the insulating film to be formed as the cap for fabrication of the electrode. If the side wall is sufficiently high, the opposed area of the memory nodes (72, 73) and the control electrode (5) can be made larger than that of the memory nodes (72, 73) and the silicon substrate. Consequently, when a voltage is applied to the control electrode (5), the electric field in the tunnel film (19) is stronger than the electric field in the interlayer film (20). As the result, a strong electric field is generated in the tunnel film (19) with a comparatively small voltage of the control electrode. This contributes to a reduction of writing voltage and an increase in writing speed. Erasing operation is accomplished by applying a negative voltage (say, −16 V) to the word line (5), thereby extracting electrons toward the substrate. It is also possible to generate a strong electric field in the tunnel film (19) with a negative voltage of comparatively small absolute value. This contributes to a reduction of erasing voltage and an increase in erasing speed.

The difference in manufacturing process is explained in the following. In Example 1, the side wall (43) is formed once and an impurity is implanted into the diffusion layers (2, 3, 6, 7) by using the side wall as a mask, and finally, this side wall is removed. In this example, the polysilicon side walls (72, 73) formed as the memory node are used as a mask for implantation of impurity into the diffusion layers (2, 3, 6, 7). Immediately after that, the interlayer film (20) is formed. The process in this manner is simple. On the other hand, it should be avoided that the memory nodes are connected by the cells which are driven by different word lines. To this end, it is necessary to separate them in the direction penetrating the paper in FIG. 15. This procedure is not necessary in Example 1 in which the memory nodes are separated. The separating step may be accomplished collectively by self-alignment with the word line when the word line is formed.

EXAMPLE 5

Figure 16:
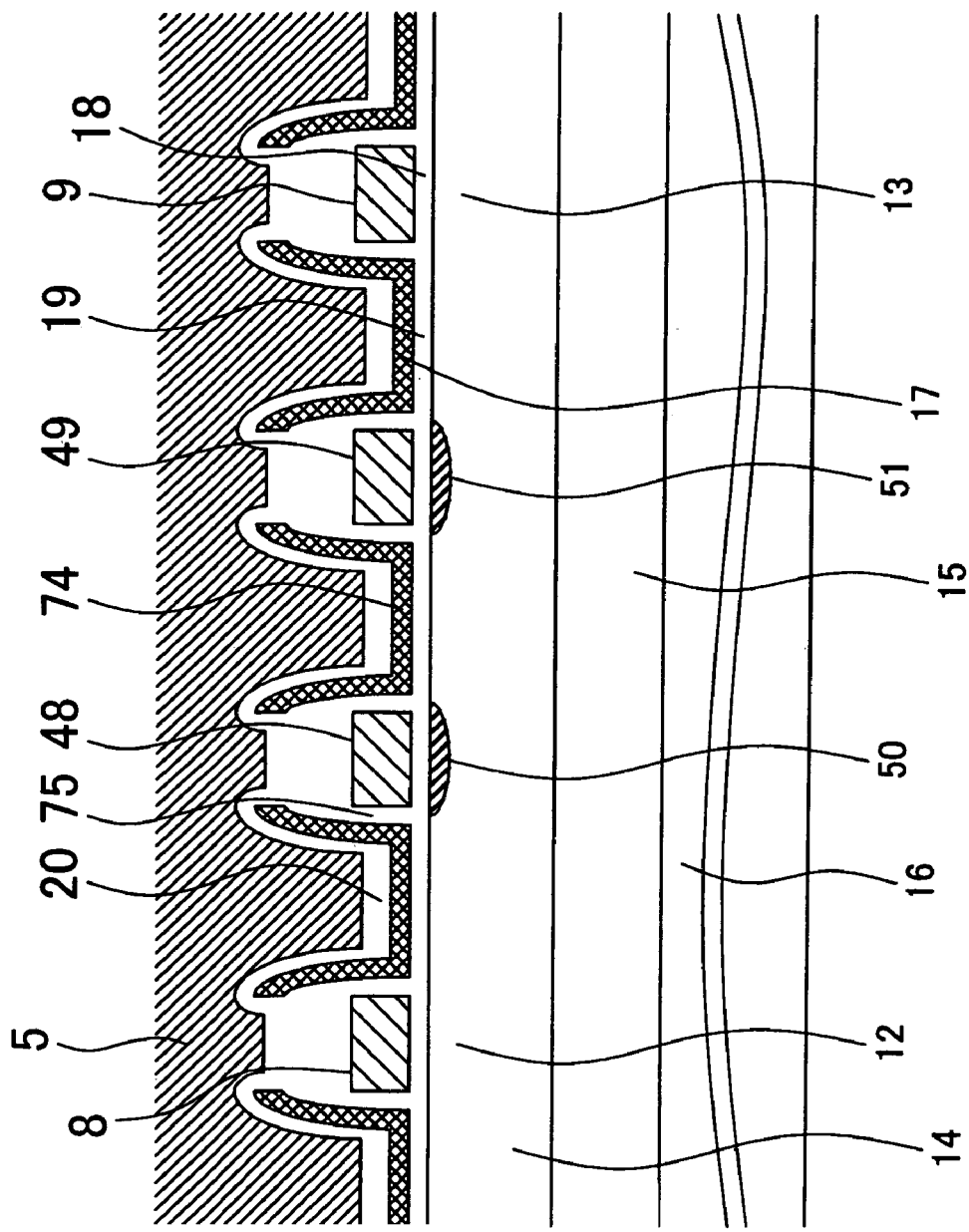
FIG. 16 is a sectional view showing the structure of the memory cell array of the semiconductor memory device in Example 5.

FIG. 16 shows the fifth example of the present invention. It is a sectional view corresponding to FIG. 9 in Example 2. In this example, the memory node is formed from polysilicon (which covers the side wall (75) of the assist electrodes (4, 8, 9)) instead of being formed from fine particles (10, 11) in Example 2. In Example 2, memory is made at two places between the adjacent assist electrodes (say, 48 and 49); however, in this example, only one continuous memory node is formed. The threshold values at multiple levels are formed by changing the amount of charge injected into the memory node. In this way, multiple value memory is accomplished. The voltage for writing and reading may be accomplished in the same way as in Example 2. However, it is not necessary to perform memory at two places. This obviates the necessity of replacing the roles of the adjacent assist electrodes (say, 48 and 49). The writing operation may be accomplished in the same way as in Example 3. In this case, too, the memory node between the adjacent assist electrodes is one place, and there is no need to perform writing and reading operations on two places. If the side wall (75) is set sufficiently high as in Example 4, it is possible to make the opposing area of the memory node (74) and the control electrode (5) larger than the opposing area of the memory node (74) and the silicon substrate. As the result, when a voltage is applied to the control electrode (5), the electric field on the tunnel film (19) is stronger than the electric field on the interlayer film (20), and this produces the same effect as in Example 4.

EXAMPLE 6

Figure 17:
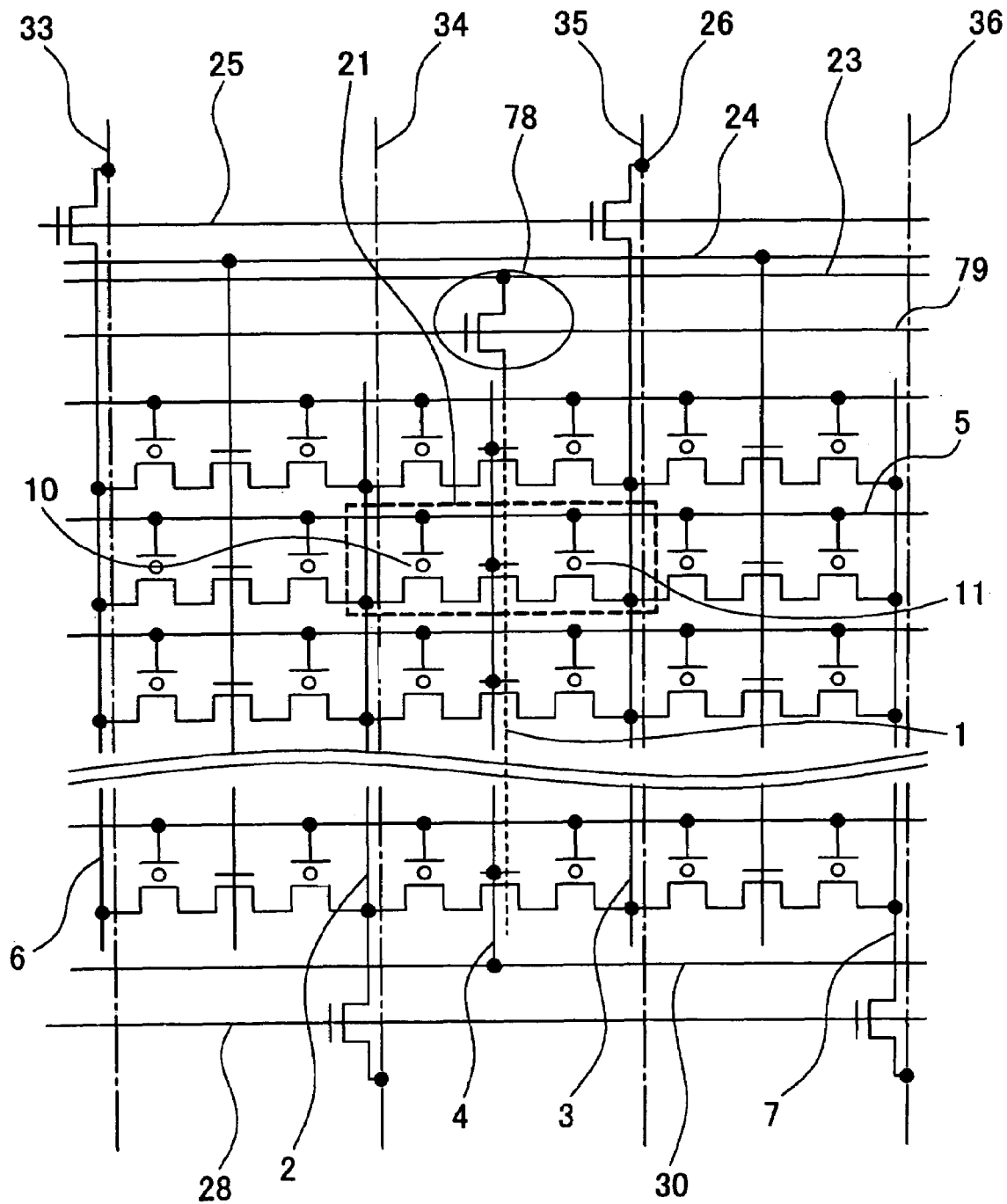
FIG. 17 is an equivalent circuit diagram of the memory cell array of the semiconductor memory device in Example 6.

FIG. 17 shows the sixth example of the present invention. The sectional view is identical with FIG. 1, and the array structure is also basically identical with that in Example 1. The only difference is that the inversion layer (1) is formed under the assist electrode and the switch (78) is formed between the wirings (23) to supply a voltage to this inversion layer. Incidentally, the equivalent circuit diagrams in Examples 1 to 5 show either of the assist electrode and the inversion layer formed thereunder (whichever necessary for explanation of connection) for the sake of brevity. However, FIG. 17 shows both of the assist electrode (4) and the inversion layer (1) formed thereunder (when the former is referenced for explanation of effect) However, only the assist electrode wiring is shown for the adjacent assist electrodes (8, 9) used for element isolation in explanation. In practice, however, the same switching structure is provided also in the assist electrodes (8, 9), so that it is possible to make the wiring (29) conductive or non-conductive.

If this switch (78) is made conductive in the reading operation, the operation is the same as that in Example 1. The feature resides in the writing operation. In the writing operation, Example 1 is advantageous over this example in that the area can be made small for the lack of the switch and the production cost is low accordingly. However, it poses the following problem. As mentioned earlier, a low voltage is applied to the assist electrode at the time of writing, so that the substrate surface thereunder is made to have a high resistant. At this time, a conduction state with a high resistance arises between the memory cell (21) in which writing is to be made and the wiring (23) through which a voltage is supplied to the inversion layer. The assist electrodes are usually very long (in the lengthwise direction or the Y-direction on the paper) compared with the line width; therefore, the potential under the assist electrode is determined nearly by the route from the diffusion layer 2 (2) under the word line (5) to the diffusion layer 1 (3) across the part under the assist electrode. However, it is also affected secondarily by the current route that extends from the wiring (23) through the substrate surface under the lengthwise direction of the assist electrode. Moreover, the effect varies depending on the length from the contact position. In this example, the signal wire (79) is set so that the switch (78) becomes non-conductive. In this way, it is possible to eliminate the above-mentioned current route and to reduce the place-dependent variation in the writing characteristics. The method for reducing writing variation by supplying a voltage to the wiring of the inversion layer through the switch as illustrated in this example may be effectively applied to other examples, and this structure may also be used in other examples as well.

EXAMPLE 7

Figure 18:
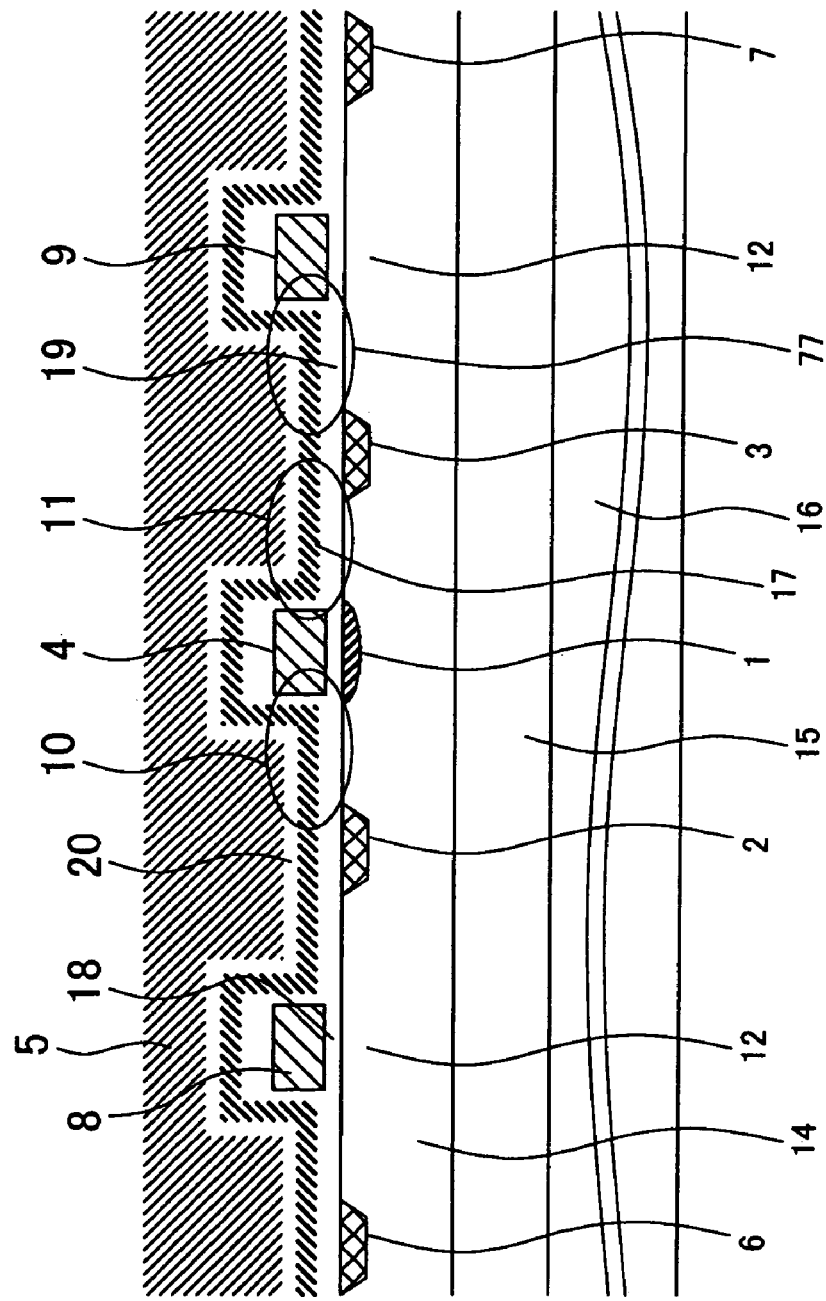
FIG. 18 is a sectional view showing the structure of the memory cell array of the semiconductor memory device in Example 7.

FIG. 18 shows the seventh example of the present invention. This example differs from Example 1 only in that the memory node is formed from SiN (80). There is no difference between them in the array structure and operation. SiN permits more highly selective dry etching or wet etching than $SiO_2$. Therefore, it permits easy removal of those parts (such as peripheral circuits) other than memory cells in the manufacturing process. In addition, SiN usually has traps in high density and hence it does not need any technology to form particles in high density as in the case where the memory node is formed from a metal or semiconductor. This leads to a reduction in development cost. Also, SiN for the memory node may be replaced by any other trapping insulating film.

EXAMPLE 8

The eighth example of the present invention will be explained with reference to FIGS. 1, 2, 3, and 19. This example differs from Example 1 in the writing operation. The method of writing in the memory cell as illustrated in Example 1 operates the assist electrode (4), which is set at a comparatively low potential, in a sub-threshold region, in order to create a conduction state with a high resistance in the substrate surface under the assist electrode (4). Consequently, the characteristics of writing in the memory cell is greatly affected by variation in dimensions of the assist electrode and variation in the applied voltage. In the case where the gate oxide film under the assist electrode is 9 nm thick, if the voltage of the assist electrode fluctuates between ±0.1 V, the amount of electrons injected into the charge storage region changes by about one order of magnitude. In addition, the internal power source to supply channel current is operating at the time of writing, there is the possibility that the potential of the assist electrode changes under the influence of noise from the internal power source. As mentioned above, the writing characteristics of the memory cell is greatly affected by the voltage of the assist electrode; therefore, there is the possibility that even a very small noise from the internal power source changes the characteristics.

Moreover, the writing operation is accomplished by applying the writing bias and repeating the verification of the threshold value until all of the threshold values reach a prescribed value in the memory cells for which writing is performed simultaneously. Therefore, if there is variation in the characteristics of the memory cells, the number of application of the writing bias and the number of repetitions of verification of the threshold value increases, and this prolongs time required for writing. Consequently, there is an apprehension for an increase in time for writing due to variation in dimensions of the assist electrode, variation in voltage applied to the assist electrode, and influence of driving noise from the internal power source.

Moreover, in order to realize a multiple-value memory capable of storing data larger than 2 bits per memory cell, it is necessary to have a narrow distribution of threshold values corresponding to each data. Therefore, the above-mentioned variation in the writing characteristics greatly increases time for writing in the memory.

This example makes it possible to reduce the variation in writing characteristics which results from the assist electrode.

Figure 19:
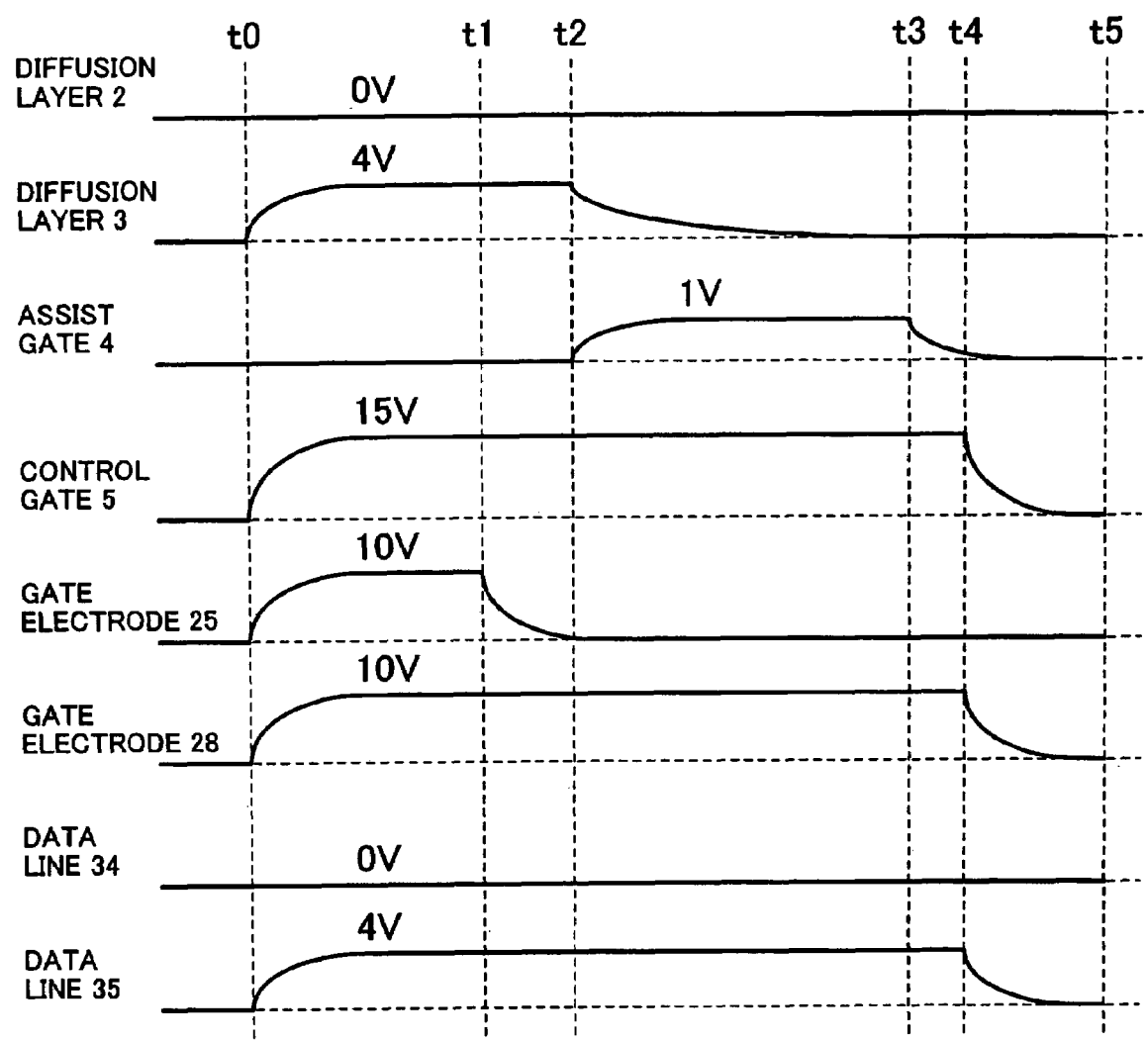
FIG. 19 is a diagram showing the timing wave form for writing in the semiconductor memory device in Example 8.
Figure 20:
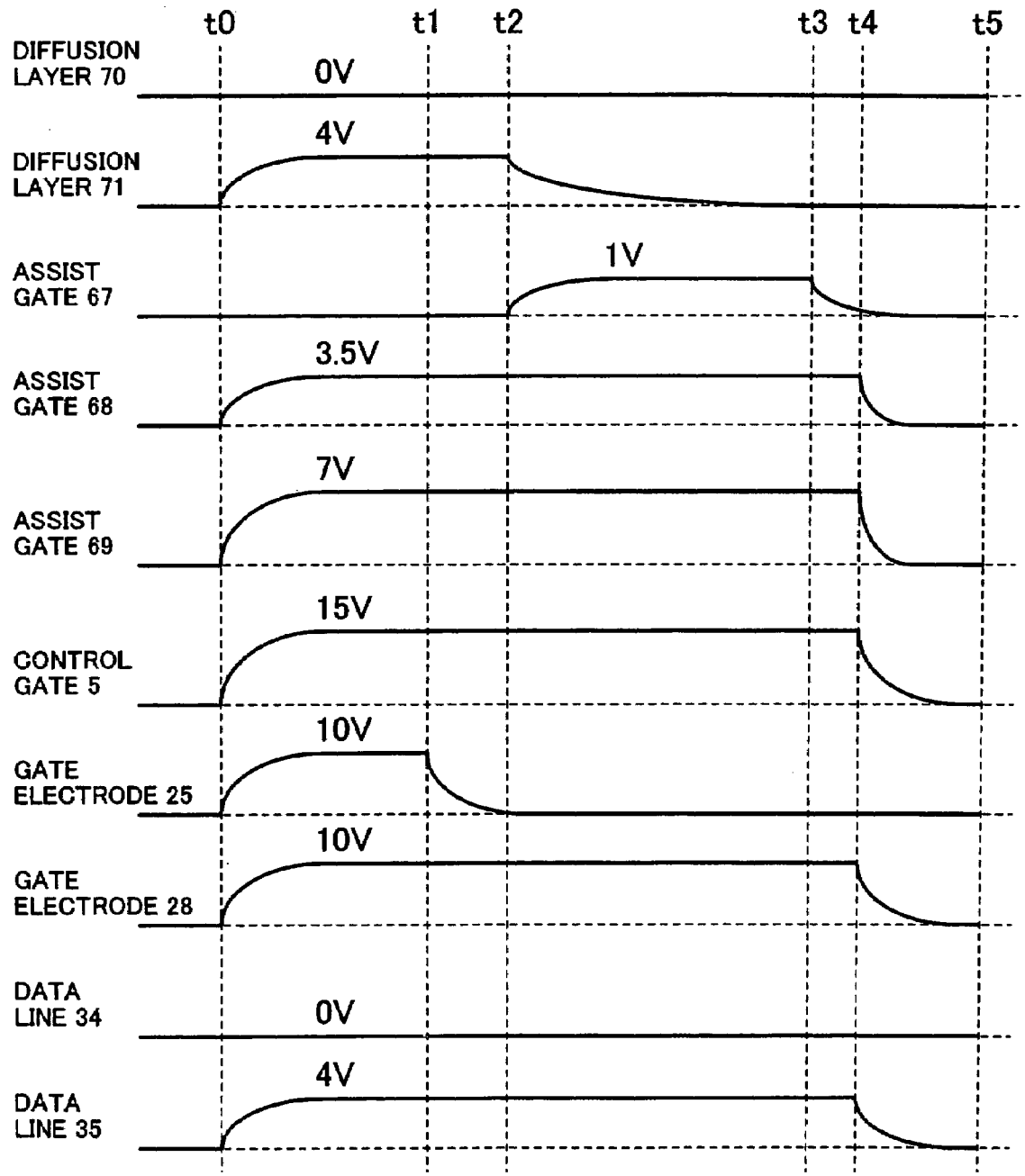
FIG. 20 is a diagram showing the timing wave form for writing in the semiconductor memory device in Example 9.
Figure 21:
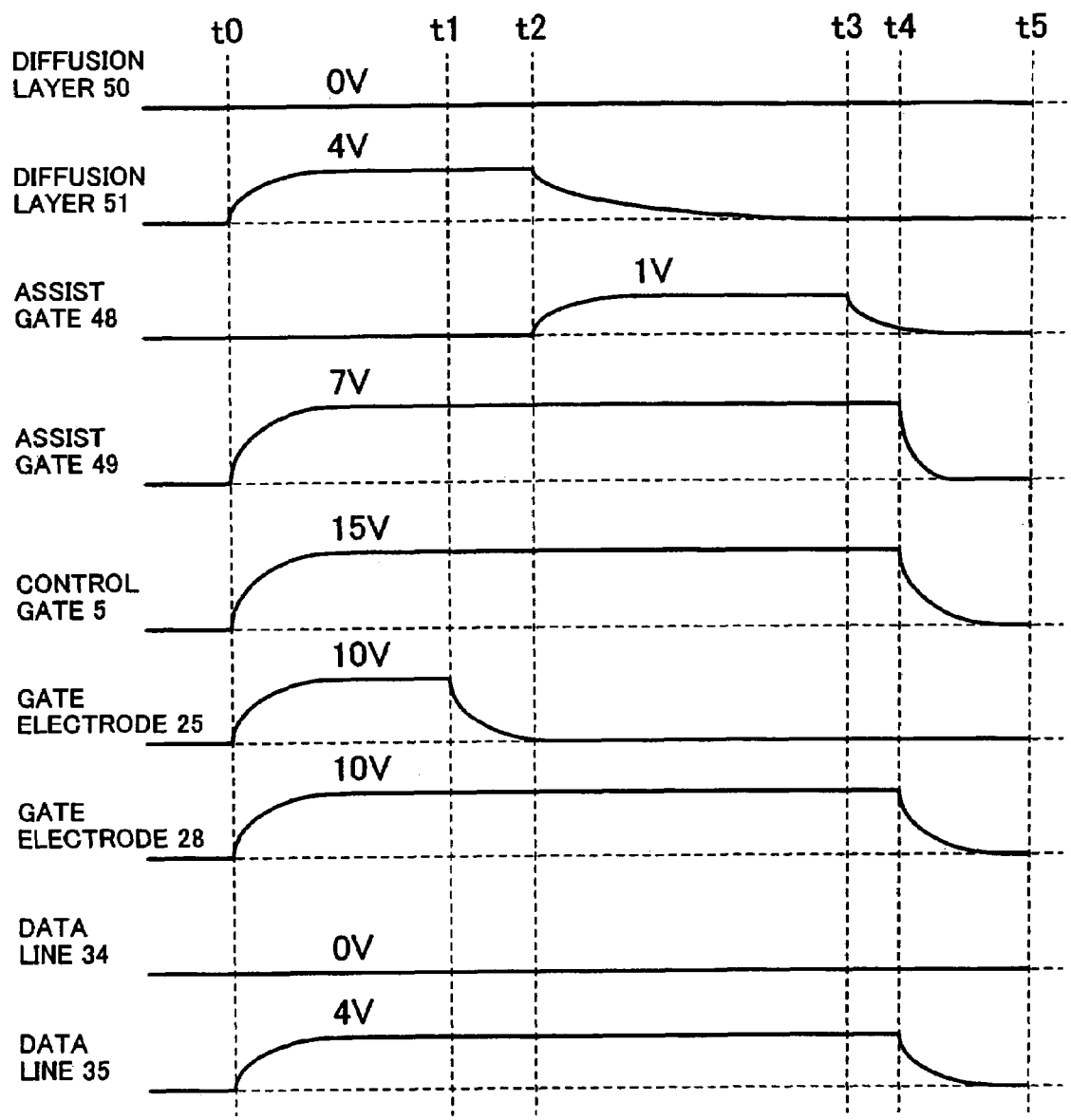
FIG. 21 is a diagram showing the timing wave form for writing in the semiconductor memory device in Example 10.

A detailed description is given below with reference to FIG. 19. At time t0, the data line (35) is set at 4 V, which is the writing drain voltage, the control electrode (5) is set at 15 V, which is the writing word voltage, and the gate electrodes (25, 28) are set at 10 V. As the result, the diffusion layer (2) is set at 0 V and the diffusion layer (3) is set at 4 V. After that, at time t1, the gate electrode (25) is lowered to 0 V and connection between the data line (35) and the diffusion layer (3) is broken, so that the diffusion layer (3) becomes floating. If the capacity of the diffusion layer is represented by Cd, the amount of charge (represented by Qd) stored in the diffusion layer (3) is given by Cd×4 coulombs. After that, at time t2, the assist electrode (4) is raised to 1 V, which is the writing voltage, so that the charge Qd stored in the diffusion layer (3) is discharged to the diffusion layer (2) through the substrate surface under the charge storage region (11), the assist electrode (4), and the charge storage region (10). At this time, the substrate surface except for that under the assist electrode (4) is in a low-resistance state; therefore, the electric field concentrates under the right end of the assist electrode (4) if there is a potential difference between the diffusion layers. This results in hot electrons. The thus generated hot electrons are attracted toward the control electrode (5) which has a high potential, and they jump over the potential barrier of the tunnel insulating film (19) and are injected into the charge storage region (11). At this time, the substrate surface under the assist electrode (4) is in a state of high resistance, the current flowing along the way between the diffusion layers (2, 3) is not so large, and hence the injection of hot electrons is more efficient than in the case where the assist electrode structure does not exist. Also, in the case where writing is not necessary, the diffusion layer (2) is set at about 1 V or the diffusion layer (3) is set at 0 V. In this situation, there is no potential difference between the diffusion layers (2, 3) and hence hot electrons do not appear and charge injection does not take place. If the non-selected word line (52) is fixed at a sufficiently low voltage (say, 0 V) and the channel of the memory cell driven by the non-selected word line is made non-conductive, the writing of information is not performed.

In the above-mentioned writing system, the writing terminates automatically when the charge stored in the diffusion layer has been discharged completely. The amount of charge (Qg) injected into the charge storage region (11) is represented by $Qg=Qd \times \gamma$ (where $\gamma$ denotes the injection efficiency). Here, the injection efficiency $\gamma$ is a function of the potential of the charge storage region (11), the drain voltage, and the voltage of the assist electrode (4). It is assumed to be constant although it varies during the writing operation. The dependence of the injection efficiency $\gamma$ on the voltage of the assist electrode is comparatively small. For example, when the voltage of the assist electrode fluctuates between ±0.1 V, the value of $\gamma$ varies by only 0.3 order of magnitude. Since the charge Qd stored in the diffusion layer is constant, the Qg (which represents the writing characteristics) varies by only 0.3 order of magnitude. The writing method in Example 1 suffers variation by one order of magnitude or more, whereas the writing method in this example is very little subject to variation. This leads to a reduction in time for writing.

The above-mentioned writing operation produces the following effect. After charge has been stored in the diffusion layer, the writing is carried out by using this charge; therefore, at the time of actual writing, it is possible to inactivate the power source of the writing drain. This saves the assist electrode from noise from the power source of the writing drain, and this leads to a stable writing operation. Also, it is only necessary to supply charge to a constant capacity, it is easy to design the power source of the writing drain. For example, according to the conventional system, a certain margin is necessary in consideration of variation and a large current supply capability is necessary. By contrast, this system is free from variation in the amount of charge to be supplied and hence a minimum of current supply capability will suffice. For this reason, it is possible to greatly reduce the size of the power circuit.

The idea of this example can be applied to the case in which the memory node is formed from polysilicon fabricated as the side wall of the assist electrode (as in Example 4) instead of being formed from fine particles (as in Example 1). It can also be applied to the case in which the memory node is formed from SiN as in Example 7.

EXAMPLE 9

The ninth example of the present invention will be explained with reference to FIGS. 12, 13, 14, and 20. This example differs from Examples 3 and 5 in the writing operation. In Example 3, writing in the memory cell requires that the substrate surface under the assist electrode (67) be in a conduction state with a high resistance. To this end, the assist electrode (67) is set at a comparatively low potential, and it is made to operate in the sub-threshold region. Therefore, the writing characteristics of the memory cell is greatly affected by variation in dimensions of the assist electrode and variation in applied voltage. In the case where the gate oxide film under the assist electrode has a thickness of 9 nm, for example, the amount of electrons injected into the charge storage region varies by about one order of magnitude if the voltage of the assist electrode fluctuates between ±0.1 V. Moreover, the internal power source to supply the channel current operates at the time of writing, there is the possibility that the potential of the assist electrode changes under the influence of noise from the internal power source. Since the writing characteristics of the memory cell is greatly affected by the voltage of the assist electrode as mentioned above, there is the possibility that the driving noise from the internal power source, however small it might be, varies the characteristic properties.

Moreover, the writing operation is accomplished by applying the writing bias and repeating the verification of the threshold value until all of the threshold values reach a prescribed value in the memory cells for which writing is performed simultaneously. Therefore, if there is variation in the characteristics of the memory cells, the number of application of the writing bias and the number of repetition of verification of the threshold value increases, and this prolongs time required for writing. Consequently, there is an apprehension for an increase in time for writing due to variation in dimensions of the assist electrode, variation in voltage applied to the assist electrode, and influence of driving noise from the internal power source.

Moreover, in order to realize a multiple-value memory capable of storing data larger than 2 bits per memory cell, it is necessary to have a narrow distribution of threshold values corresponding to each data. Therefore, the above-mentioned variation in the writing characteristics greatly increases time for writing in the memory.

This example makes it possible to reduce the variation in writing characteristics which results from the assist electrode. A detailed description is given below with reference to FIG. 20. At time t0, the data line (35) is set at 4 V, which is the writing drain voltage, the control electrode (5) is set at 15 V, which is the writing word voltage, and the gate electrodes (25, 28) are set at 10 V. Moreover, the assist electrode (68) is set at 3.5 V and the assist electrode (69) is set at 7 V, so that the inversion layer is formed under the assist electrode. With power supplied respectively from the data lines (34, 35), the inversion layer (70) becomes 0 V and the inversion layer (71) becomes 4 V. After that, at time t1, the gate electrode (25) is lowered to 0 V and connection between the data line (35) and the diffusion layer (71) is broken, so that the diffusion layer (71) becomes floating. If the capacity of the diffusion layer is represented by Ci, the amount of charge (represented by Qi) stored in the inversion layer (71) is given by Ci×4 coulombs. After that, at time t2, the assist electrode (67) is raised to 1 V, which is the writing voltage, so that the charge Qi stored in the inversion layer (71) is discharged to the inversion layer (70) through the substrate surface under the charge storage regions (66, 11), the assist electrode (67), and the charge storage regions (10, 65). At this time, the substrate surface except for that under the assist electrode (67) is in a low-resistance state; therefore, the electric field concentrates under the right end of the assist electrode (67) if there is a potential difference between the diffusion layers. This results in hot electrons. The thus generated hot electrons are attracted toward the control electrode (5) which has a high potential, and they jump over the potential barrier of the tunnel insulating film (19) and are injected into the charge storage region (11). At this time, the substrate surface under the assist electrode (67) is in a state of high resistance, the current flowing along the way between the diffusion layers (2, 3) is not so large, and hence the injection of hot electrons is more efficient than in the case where the assist electrode structure does not exist.

Also, in the case where writing is not necessary, the inversion layer (70) is set at about 1 V or the inversion layer (71) is set at 0 V. In this situation, there is no potential difference between the inversion layers (2, 3) and hence hot electrons do not appear and charge injection does not take place. If the non-selected word line (52) is fixed at a sufficiently low voltage (say, 0 V) and the channel of the memory cell driven by the non-selected word line is made non-conductive, the writing of information is not performed.

In the above-mentioned writing system, the writing terminates automatically when the charge stored in the inversion layer has been discharged completely. The amount of charge (Qg) injected into the charge storage region (11) is represented by Qg=Qi×γ (where γ denotes the injection efficiency). Here, the injection efficiency γ is a function of the potential of the charge storage region (11), the drain voltage, and the voltage of the assist electrode (67). It is assumed to be constant although it varies during the writing operation. The dependence of the injection efficiency γ on the voltage of the assist electrode is comparatively small. For example, when the voltage of the assist electrode fluctuates between ±0.1 V, the value of γ varies by only 0.3 order of magnitude. Since the charge Qd stored in the inversion layer is constant, the Qg (which represents the writing characteristics) varies by only 0.3 order of magnitude. The writing method in Example 3 suffers variation by one order of magnitude or more, whereas the writing method in this example is very little subject to variation. This leads to a reduction in time for writing.

The above-mentioned writing operation produces the following effect. After charge has been stored in the inversion layer, the writing is carried out by using this charge; therefore, at the time of actual writing, it is possible to inactivate the power source of the writing drain. This saves the assist electrode from noise from the power source of the writing drain, and this leads to a stable writing operation. Also, it is only necessary to supply charge to a constant capacity, it is easy to design the power source of the writing drain. For example, according to the conventional system, a certain margin is necessary in consideration of variation and a large current supply capability is necessary. By contrast, this system is free from variation in the amount of charge to be supplied and hence a minimum of current supply capability will suffice. For this reason, it is possible to greatly reduce the size of the power circuit.

The idea of this example can be applied to the case in which the memory node is formed from polysilicon fabricated as the side wall of the assist electrode (as in Example 4) instead of being formed from fine particles (as in Example 1). It can also be applied to the case in which the memory node is formed from SiN as a matter of course.

EXAMPLE 10

The tenth example of the present invention will be explained with reference to FIGS. 9, 10, 11, and 21. This example differs from Examples 2 and 5 in the writing operation. In Example 2, writing in the memory cell requires that the substrate surface under the assist electrode (48) be in a conduction state with a high resistance. To this end, the assist electrode (48) is set at a comparatively low potential, and it is made to operate in the sub-threshold region. Therefore, the writing characteristics of the memory cell is greatly affected by variation in dimensions of the assist electrode and variation in applied voltage. In the case where the gate oxide film under the assist electrode has a thickness of 9 nm, for example, the amount of electrons injected into the charge storage region varies by about one order of magnitude if the voltage of the assist electrode fluctuates between ±0.1 V. Moreover, the internal power source to supply the channel current operates at the time of writing, there is the possibility that the potential of the assist electrode changes under the influence of noise from the internal power source. Since the writing characteristics of the memory cell is greatly affected by the voltage of the assist electrode as mentioned above, there is the possibility that the driving noise from the internal power source, however small it might be, varies the characteristic properties.

Moreover, the writing operation is accomplished by applying the writing bias and repeating the verification of the threshold value until all of the threshold values reach a prescribed value in the memory cells for which writing is performed simultaneously. Therefore, if there is variation in the characteristics of the memory cells, the number of application of the writing bias and the number of repetition of verification of the threshold value increases, and this prolongs time required for writing. Consequently, there is an apprehension for an increase in time for writing due to variation in dimensions of the assist electrode, variation in voltage applied to the assist electrode, and influence of driving noise from the internal power source.

Moreover, in order to realize a multiple-value memory capable of storing data larger than 2 bits per memory cell, it is necessary to have a narrow distribution of threshold values corresponding to each data. Therefore, the above-mentioned variation in the writing characteristics greatly increases time for writing in the memory.

This example makes it possible to reduce the variation in writing characteristics which results from the assist electrode. A detailed description is given below with reference to FIG. 21. At time t0, the data line (35) is set at 4 V, which is the writing drain voltage, the control electrode (5) is set at 15 V, which is the writing word voltage, and the gate electrodes (25, 28) are set at 10 V. At the same time, the assist electrode (49) is set at 7 V, so that the inversion layer under the assist electrode has a voltage of 4 V. After that, at time t1, the gate electrode (25) is lowered to 0 V and connection between the data line (35) and the inversion layer (51) is broken, so that the inversion layer (51) becomes floating. If the capacity of the inversion layer is represented by Ci, the amount of charge (represented by Qi) stored in the inversion layer (51) is given by Ci×4 coulombs. After that, at time t2, the assist electrode (48) is raised to 2 V, which is the writing voltage, so that the charge Qi stored in the inversion layer (51) is discharged to the data line (34) through the substrate surface under the charge storage regions (10, 11) and the assist electrode (48). At this time, the substrate surface except for that under the assist electrode (48) is in a low-resistance state; therefore, the electric field concentrates under the right end of the assist electrode (48) if there is a potential difference between the diffusion layers. This results in hot electrons. The thus generated hot electrons are attracted toward the control electrode (5) which has a high potential, and they jump over the potential barrier of the tunnel insulating film (19) and are injected into the charge storage region (10). At this time, the substrate surface under the assist electrode (48) is in a state of high resistance, the current flowing along the way between the inversion layers (51) and the data line (34) is not so large, and hence the injection of hot electrons is more efficient than in the case where the assist electrode structure does not exist. Also, in the case where writing is not necessary, the data line (34) is set at about 2 V or the inversion layer (51) is set at 0 V. In this situation, hot electrons do not appear and hence charge injection does not take place. If the non-selected word line (52) is fixed at a sufficiently low voltage (say, 0 V) and the channel of the memory cell driven by the non-selected word line is made non-conductive, the writing of information is not performed.

In the above-mentioned writing system, the writing terminates automatically when the charge stored in the inversion layer has been discharged completely. The amount of charge (Qg) injected into the charge storage region (10) is represented by Qg=Qi×γ (where γ denotes the injection efficiency). Here, the injection efficiency γ is a function of the potential of the charge storage region (10), the drain voltage, and the voltage of the assist electrode (48). It is assumed to be constant although it varies during the writing operation. The dependence of the injection efficiency γ on the voltage of the assist electrode is comparatively small. For example, when the voltage of the assist electrode fluctuates between ±0.1 V, the value of γ varies by only 0.3 order of magnitude. Since the charge Qd stored in the inversion layer is constant, the Qg (which represents the writing characteristics) varies by only 0.3 order of magnitude. The writing method in Example 1 suffers variation by one order of magnitude or more, whereas the writing method in this example is very little subject to variation. This leads to a reduction in time for writing.

If it is desirable to perform writing in the charge storage region (11) at the other end of the cell, it is only necessary to replace the setting of the assist electrodes (48, 49), the data lines (34, 35), and the inversion layer wirings (50, 51).

The above-mentioned writing operation produces the following effect. After charge has been stored in the inversion layer, the writing is carried out by using this charge; therefore, at the time of actual writing, it is possible to inactivate the power source of the writing drain. This saves the assist electrode from noise from the power source of the writing drain, and this leads to a stable writing operation. Also, it is only necessary to supply charge to a constant capacity, it is easy to design the power source of the writing drain. For example, according to the conventional system, a certain margin is necessary in consideration of variation and a large current supply capability is necessary. By contrast, this system is free from variation in the amount of charge to be supplied and hence a minimum of current supply capability will suffice. For this reason, it is possible to greatly reduce the size of the power circuit.

The writing system of this example can be applied to the case in which the memory node is formed from polysilicon fabricated as the side wall of the assist electrode instead of being formed from fine particles (as in Example 2). It can also be applied to the case in which the memory node is formed from SiN.

EXAMPLE 11

The eleventh example of the present invention will be explained with reference to FIGS. 9 to 11 and 22 to 24. This example differs from Examples 2 and 5 in the writing operation. In Example 2, writing is accomplished in such a way that the inversion layer at a low potential (for example, the inversion layer (50) in FIG. 11) is set at a high resistance so that the electric field concentrates at this end and hot electrons appear. This system poses a problem that the resistance of the inversion layer varies depending on the distance from the diffusion layer (61). In other words, the resistance of the inversion layer decreases as the cell gets closer to the diffusion layer, which is the connection part between the data line (34) and the inversion layer (50), and the resistance of the inversion layer becomes higher as the distance of the cell increases. Variation in resistance greatly changes the writing characteristics. This leads to the place dependence of the writing characteristics.

According to this example, it is possible to reduce the place dependence of the writing characteristics.

Figure 22:
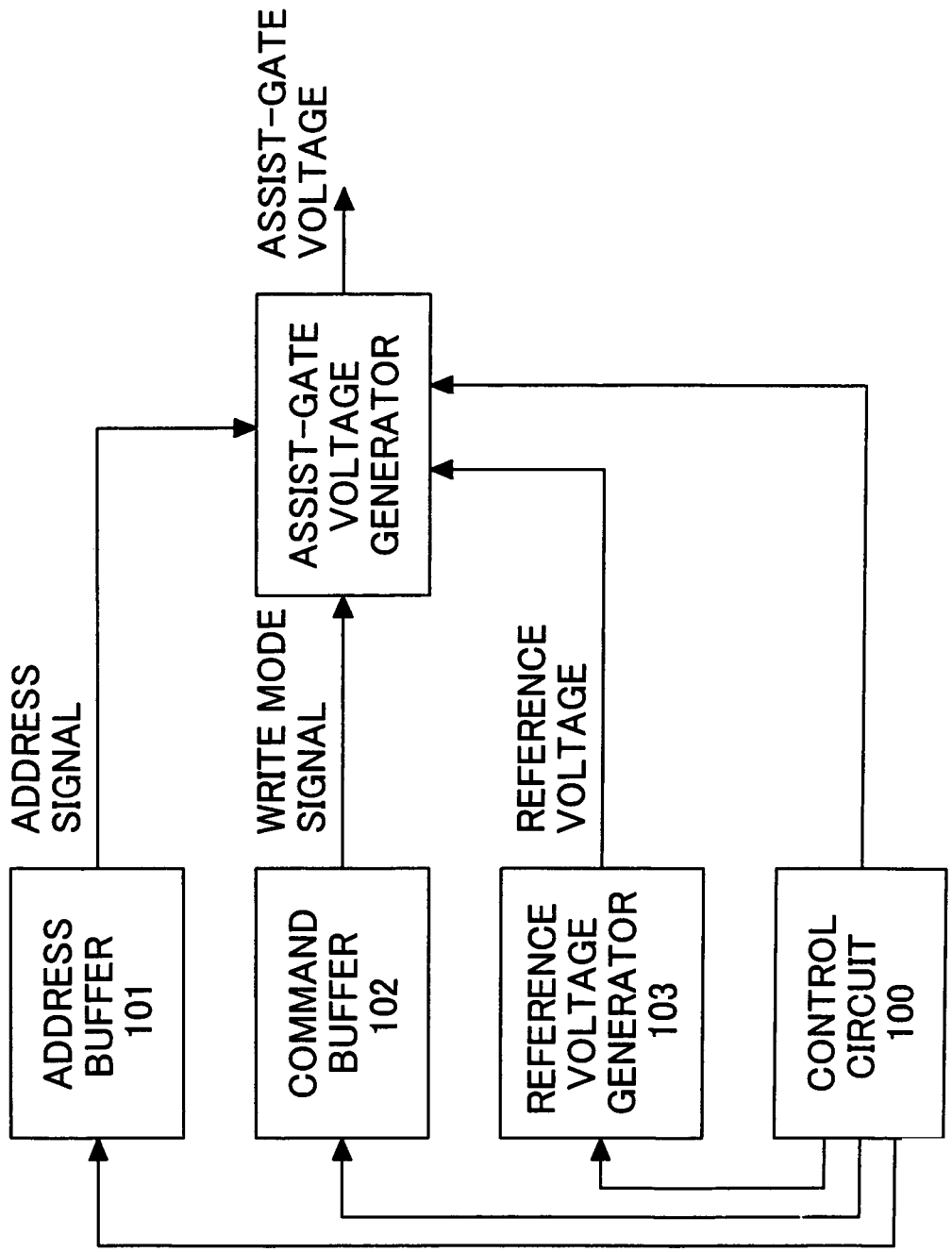
FIG. 22 is a block diagram showing the voltage generating circuit for the assist electrode in the semiconductor memory device in Example 11.
Figure 23:
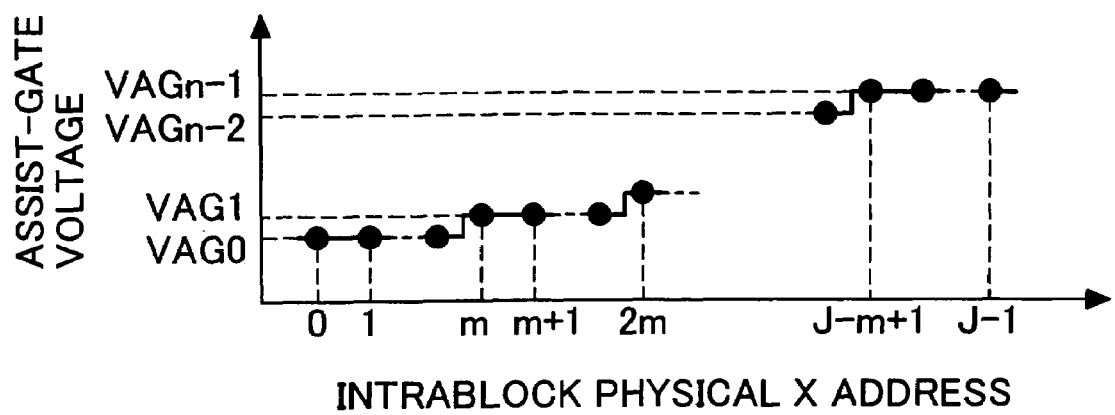
FIG. 23 is a diagram showing the output voltage in the voltage generating circuit for the assist electrode in the semiconductor memory device in Example 11.
Figure 24:
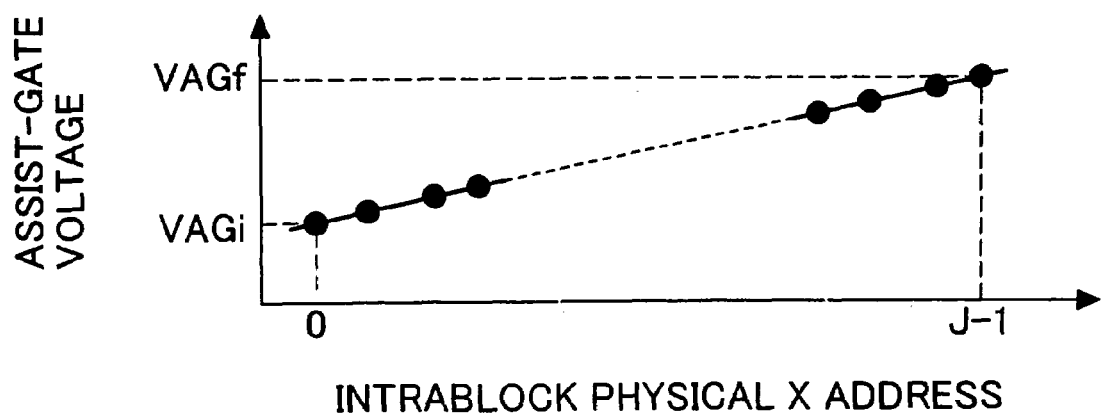
FIG. 24 is a diagram showing the output voltage (which is different from that in FIG. 23) in the voltage generating circuit for the assist electrode in the semiconductor memory device in Example 11.

FIG. 22 shows a circuit structure to realize this example. FIGS. 23 and 24 show an output from the voltage generating circuit of the assist electrode shown in FIG. 22. In FIGS. 23 and 24, the physical address in the block increases as the memory cell gets far from the connecting part of the data line and the inversion layer. (The value 0 represents the memory cell which is closest to the connecting part.)

The above-mentioned problem is solved by increasing the voltage of the assist electrode in proportion to the physical address, thereby making uniform the writing characteristics. The voltage of the assist electrode may be small when the physical address is small. The voltage generating circuit (104) of the assist electrode in FIG. 22 can be made to change in output voltage according to the physical position of the memory cell in which writing is performed, when it receives the address signal from the address buffer (101), the writing mode selecting signal from the command buffer (102), the reference voltage from the reference voltage generating circuit (103), and the control signal from the control circuit (100). For example, the output voltage can be made to change in a stepped pattern as shown in FIG. 23 or in a continuous pattern as shown in FIG. 24. It is also possible to set up such that the output voltage changes in proportion to the logarithm of the physical address.

In this way it is possible to suppress the position dependence within the block and to maintain the high-speed writing characteristics. This system can be applied to Example 2 as well as Example 10 as a matter of course. Example 12 (Compensation at the time of reading)

The twelfth example of the present invention will be described with reference to FIGS. 9 to 11 and 26 to 28. The feature of this example resides in compensating writing variation by the reading operation. It has been mentioned above that if the inversion layer is used as the local wiring, there is a significant variation in the writing characteristics within the memory mat because the inversion layer has a higher resistance than the impurity diffusion layer. The dependence of this variation is systematic. In the writing operation, the inversion layer (for example, the inversion layer (50) in FIG. 11) at a low potential has a particularly high resistance. The cell suffers voltage drop less as it gets closer to the contact (57) to which voltage is applied and the diffusion layer (61) connected thereto, and the cell with a small voltage drop permits high-speed writing. Therefore, if writing is performed under the same condition of voltage application, the threshold value is higher in the cell which is closer to the diffusion layer (61).

This example is designed to reduce the position dependence of the writing characteristics by the reading method even if it exists.

Figure 26:
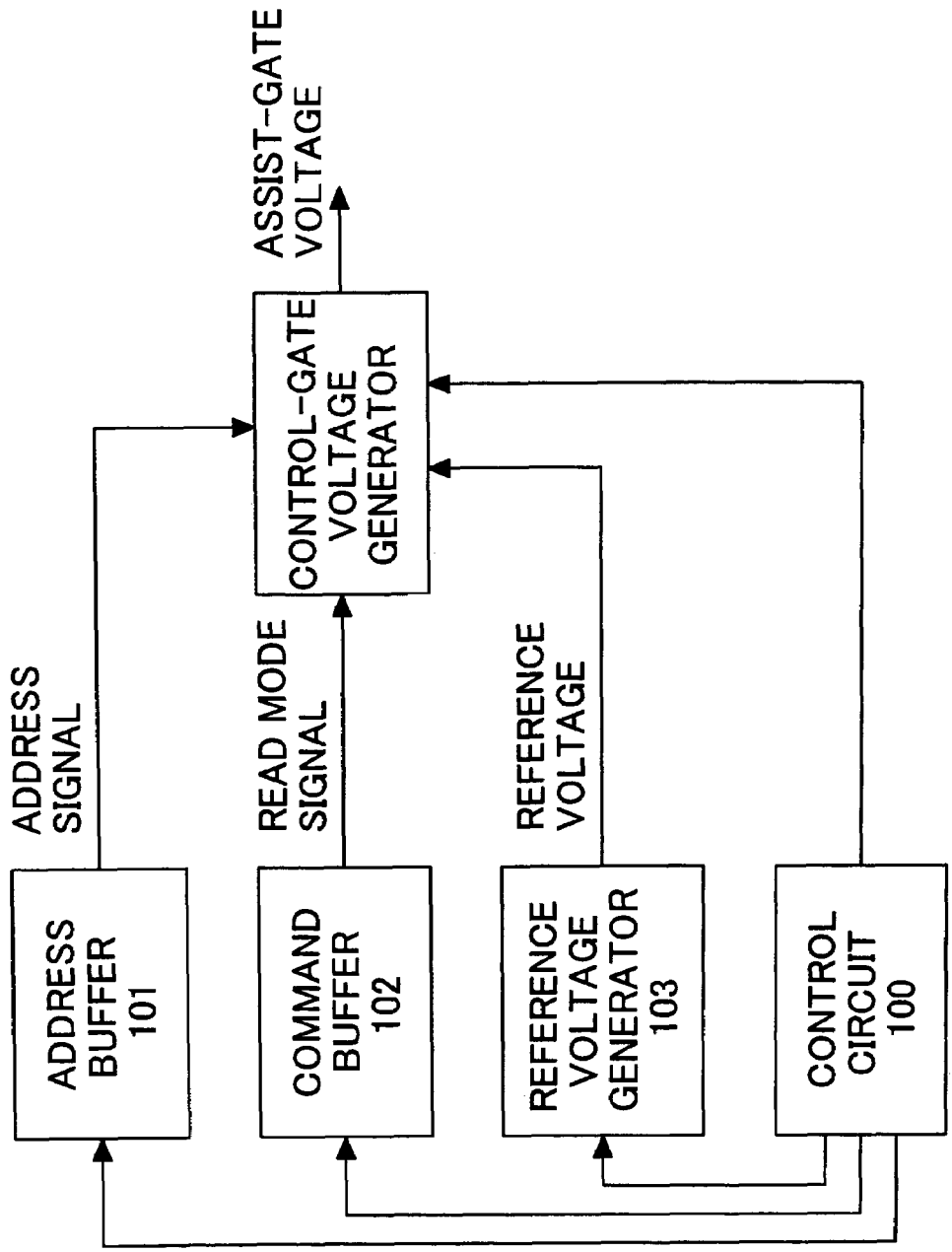
FIG. 26 is a block diagram showing the voltage generating circuit for the assist electrode in the semiconductor memory device in Example 12.
Figure 27:
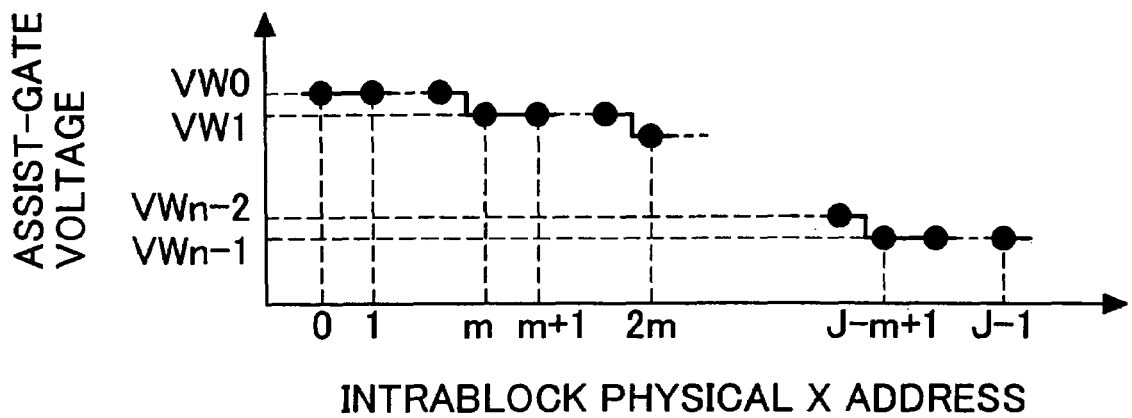
FIG. 27 is a diagram showing the output voltage in the voltage generating circuit for the assist electrode in the semiconductor memory device in Example 12.
Figure 28:
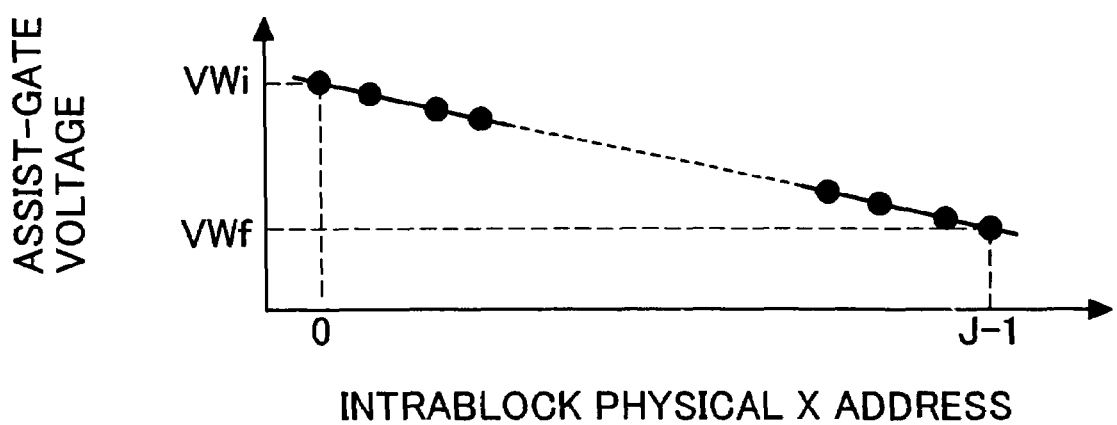
FIG. 28 is a diagram showing the output voltage (which is different from that in FIG. 27) in the voltage generating circuit for the assist electrode in the semiconductor memory device in Example 12.

FIG. 26 is a circuit structure to realize this example. FIGS. 27 and 28 show the outputs from the voltage generating circuit of the control electrode shown in FIG. 26. In FIGS. 27 and 28, the value 0 of the physical address within the block represents the memory cell which is closest to the connecting part of the data line and the inversion layer. This value increases as the memory cell gets far.

The above-mentioned problem is solved as follows. When the same information is read out, the voltage of the control electrode is set higher according as the physical address gets smaller and the voltage of the control electrode is set lower according as the physical address gets larger, so that the writing characteristics are compensated. The smaller is the physical address, the more is the amount of injected electrons. Therefore, the threshold voltage is high, and compensation can be achieved by applying a higher control electrode voltage. The voltage generating circuit (107) of the control electrode in FIG. 22 varies in the output voltage depending on the physical position of the memory cell in which writing is made, when it receives the address signal from the address; buffer (101), the writing mode selecting signal from the command buffer (102), the reference voltage from the reference voltage generating circuit (103), and the control signal from the control circuit (100). For example, the output voltage can be changed stepwise as shown in FIG. 27 or continuously as shown in FIG. 28. It is also possible to set up so that the output voltage changes in proportion to the logarithm of the physical address. In the case of multiple-value memory of both-end memory type that employs the discrete charge-storage regions, writing in the other end (11) requires that the voltages of the inversion layer wirings (50, 51) at both ends should be exchanged. In this case, it is necessary to take into consideration the distance from the diffusion layer (62) connected to the inversion layer (51) at the low-voltage side. Consequently, the voltage of the control electrode is set lower at the time of reading as the physical address gets smaller, and the voltage of the control electrode is set higher at the time of reading as the physical address gets larger. The writing characteristics are compensated in this manner.

The foregoing is intended to compensate the variation of the position dependence by changing the voltage of the control electrode according to the address at the time of reading. However, the same object may be achieved by changing the voltage of the assist electrode. In other words, the smaller the physical address, the higher the voltage of the assist electrode is set at the time of reading; and the larger the physical address, the lower the voltage of the assist electrode is set at the time of reading. Thus, the inversion layer wiring has a lower resistance relative to the cell (with a small physical address) to which a larger amount electrons have been injected, and the inversion layer wiring has a higher resistance relative to the cell (with a large physical address) to which a less amount of electrons have been injected. In this way the writing characteristics are compensated.

Incidentally, it is desirable that the inversion layer wirings (50, 51) have the same potential at the time of writing and reading. The wiring of the inversion layer should have a leader as shown in FIG. 10. One leader is attached to one end (say, 61), and the next leader is attached to the other end (say, 62). The alternate arrangement in this manner permits a loose pitch, which eliminates difficulties in fabrication. The inversion layers at both ends are set at the same voltage at the time of writing and reading. At the time of writing, the cell far away from the leader of the low-potential inversion layer has a less amount of electrons injected; however, at the time of reading, the voltage of the cell is higher than that of the leader because the cell is away from the low-potential inversion layer. As the result, the potential difference between the leader and the control electrode becomes smaller and current is hard to flow. It looks as if the threshold voltage has become large although the amount of charge held is small. As the result, the variation due to position dependence is compensated.

The above-mentioned control method makes it possible to suppress the position dependence in the block and to carry out the stable operation. This system is applicable not only to Example 2 but also to the case in which the characteristics vary depending on the position in the array owing to the data line resistance. This system may be modified such that the charge storage region is of floating gate structure with continuous semiconductor or metal.

The present invention provides a semiconductor memory device of type in which the inversion layer is utilized as the wiring. The semiconductor memory device is characterized by reduced cell-to-cell variation in writing characteristics and strong resistance to reading disturbance despite its high degree of integration. It is also characterized by low cost and high reliability.

What is claimed is:

1. A semiconductor device comprising:
    first to third regions in a semiconductor substrate, the second region being located between the first and third regions;
    a first charge storage region formed on the second region through an insulator, a distance between the first charge storage region and the first region being shorter than a distance between the first charge storage region and the third region;
    a second charge storage region formed on the second region through an insulator, a distance between the second charge storage region and the third region being shorter than a distance between the second charge storage region and the first region;
    a first electrode formed on the second region through an insulator and located between the first and second charge storage regions; and
    a second electrode formed over the first charge storage region, the second charge storage region, and the first electrode,
    wherein the second electrode extends in a first direction from the first region to the third region,
    the first electrode extends in a second direction crossing the first direction, and
    the first electrode and second electrode are arranged such that, in a write operation to the first charge storage region, electrons flow from the third region to the first region through the second region, hot electrons injected into the first charge storage region are generated in the second region, and the first electrode is supplied with a smaller voltage than a voltage supplied to the second electrode.

2. A semiconductor device according to claim 1,
    wherein in a read operation of information stored in the first charge storage region, the first electrode is supplied with a predetermined voltage to form an inversion layer, and current which corresponds to the information stored in the first charge storage region flows between the first region and the inversion layer.

3. A semiconductor device according to claim 1,
    wherein each of the first region and the third region is a diffusion layer.

4. A semiconductor device according to claim 1, wherein, in a write operation to the first charge storage region, a substrate surface under the first electrode is made conductive with a high resistance by supplying the first electrode with the smaller voltage than the voltage supplied to the second electrode.

5. A semiconductor device comprising:
    first to third regions in a semiconductor substrate, the second region being located between the first and third regions;
    a first charge storage region formed on the second region through an insulator, a distance between the first charge storage region and the first region being shorter than a distance between the first charge storage region and the third region;
    a second charge storage region formed on the second region through an insulator, a distance between the second charge storage region and the third region being shorter than a distance between the second charge storage region and the first region;
    a first electrode formed on the second region through an insulator and located between the first and second charge storage regions so as not to overlie the first charge storage region and so as not to overlie the second charge storage region, such that in a write operation to the first charge storage region, electrons flow from the third region to the first region through the second region and hot electrons injected into the first charge storage region are generated in the second region.

6. A semiconductor device according to claim 5, further comprising a second electrode formed over the first charge storage region, the second charge storage region, and the first electrode, wherein
    the second electrode extends in a first direction from the first region to the third region,
    the first electrode extends in a second direction crossing the first direction, and
    the first electrode and second electrode are arranged such that, in a write operation to the first charge storage region, the first electrode is supplied with a smaller voltage than a voltage supplied to the second electrode.

7. A semiconductor device according to claim 6, wherein, in a write operation to the first charge storage region, a substrate surface under the first electrode is made conductive with a high resistance by supplying the first electrode with the smaller voltage than the voltage supplied to the second electrode.

8. A semiconductor device according to claim 5,
    wherein in a read operation of information stored in the first charge storage region, the first electrode is supplied with a predetermined voltage to form an inversion layer, and current which corresponds to the information stored in the first charge storage region flows between the first region and the inversion layer.

9. A semiconductor device according to claim 5,
    wherein each of the first region and the third region is a diffusion layer.

* * * * *